United States Patent
Zheng et al.

(10) Patent No.: US 10,303,918 B2
(45) Date of Patent: May 28, 2019

(54) IMAGING SENSOR AND IMAGING MODULE

(71) Applicant: Shanghai Oxi Technology Co., Ltd, Shanghai (CN)

(72) Inventors: Yajie Zheng, Shanghai (CN); Hong Zhu, Shanghai (CN); Yan Ling, Shanghai (CN)

(73) Assignee: SHANGHAI OXI TECHNOLOGY CO., LTD, Shanghai (CN)

( * ) Notice: Subject to any disclaimer, the term of this patent is extended or adjusted under 35 U.S.C. 154(b) by 0 days.

(21) Appl. No.: 15/741,490

(22) PCT Filed: Jun. 9, 2017

(86) PCT No.: PCT/CN2017/087664
§ 371 (c)(1),
(2) Date: Jan. 2, 2018

(87) PCT Pub. No.: WO2018/126608
PCT Pub. Date: Jul. 12, 2018

(65) Prior Publication Data
US 2019/0042824 A1    Feb. 7, 2019

(30) Foreign Application Priority Data
Jan. 9, 2017    (CN) .......................... 2017 1 0014200

(51) Int. Cl.
*G06K 9/00*    (2006.01)
*G06K 9/20*    (2006.01)
(Continued)

(52) U.S. Cl.
CPC ........... *G06K 9/0004* (2013.01); *G06F 3/044* (2013.01); *G06F 3/0416* (2013.01);
(Continued)

(58) Field of Classification Search
CPC combination set(s) only.
See application file for complete search history.

(56) References Cited

U.S. PATENT DOCUMENTS

| 2012/0313913 | A1* | 12/2012 | Shiraki ................. G06F 3/0412 345/207 |
| 2013/0181949 | A1  | 7/2013  | Setlak |
| 2015/0371074 | A1  | 12/2015 | Lin |

FOREIGN PATENT DOCUMENTS

| CN | 104318199 A | 1/2015 |
| CN | 104866834 A | 8/2015 |
| CN | 106022276 A | 10/2016 |

OTHER PUBLICATIONS

International Search Report and Written Opinion from PCT/CN2017/087664, dated Oct. 11, 2017 (with English Translation of Written Opinion).

* cited by examiner

*Primary Examiner* — Jennifer Mehmood
*Assistant Examiner* — Deeprose Subedi
(74) *Attorney, Agent, or Firm* — Adsero IP

(57) ABSTRACT

Imaging sensor and imaging module are provided. The imaging sensor includes: a substrate; multiple pixel units disposed on the substrate, configured to acquire an optical signal carrying imaging information and convert the optical signal into an electric pixel signal, and arranged in array to form a pixel array; multiple bias voltage pseudo pixel units disposed around the pixel array, connected with the pixel units, and configured to provide a bias voltage to the pixel units; and at least one touch sensing pseudo pixel unit disposed at one side of the bias voltage pseudo pixel units which is away from the pixel units, and configured to form a capacitor structure to sense a touch to form an electric touch signal. Color aberration between the bias voltage
(Continued)

pseudo pixel units and the touch sensing pseudo pixel unit and the pixel units is reduced, and appearance of the imaging sensor is improved.

20 Claims, 10 Drawing Sheets

(51) Int. Cl.
*G06F 3/041* (2006.01)
*H04N 5/369* (2011.01)
*H01L 27/146* (2006.01)
*G06F 3/044* (2006.01)

(52) U.S. Cl.
CPC .. H01L 27/14678 (2013.01); *H01L 27/14612* (2013.01); *H01L 27/14643* (2013.01)

IMAGING SENSOR AND IMAGING MODULE

CROSS-REFERENCE TO RELATED APPLICATIONS

This application is the national phase of International Application No. PCT/CN2017/087664, filed on Jun. 9, 2017, which claims the benefit of priority to Chinese Patent Application No. 201710014200.6, filed on Jan. 9, 2017, and entitled "IMAGING SENSOR AND IMAGING MODULE", the entire disclosure of which are incorporated herein by reference.

TECHNICAL FIELD

The present disclosure generally relates to imaging sensor field, and more particularly, to an imaging sensor and an imaging module.

BACKGROUND

Fingerprint imaging recognition technology is used to realize identification by capturing fingerprint images of a person using optical fingerprint sensors and then determining whether the fingerprint images match those stored in a system before. Due to its convenience in use and uniqueness of human fingerprints, the fingerprint recognition technology has been widely applied to various fields, such as safety inspection field (for example, public security bureau or customs), entrance guard systems in buildings or consumption goods field (for example, personal computers or mobile phones).

At present, the application of imaging sensors in mobile terminals is performing unlocking using fingerprints. However, due to limited battery capacity of the mobile terminals, power management has always been a critical part of mobile terminal development so as to reduce power consumption of the imaging sensors and prolong a standby time of the imaging sensors.

Wake-up technology is a power management method in existing techniques. When a device is not being used, the device is enabled to enter a sleeping state to reduce power consumption. When the device is being used, a control signal is sent to wake up the device from the sleeping state to a working state. In an imaging sensor, the introduction of a touch wake-up function is conducive to reduce power consumption of the imaging sensor.

When fingerprint recognition technology is applied to mobile phones or other electronic devices, an imaging module becomes part of the appearance of the device and an imaging sensor needs to be exposed. However, in the existing techniques, the imaging sensor with a touch wake-up function has poor appearance and color aberration.

SUMMARY

In embodiments of the present disclosure, an imaging sensor and an imaging module are provided to reduce color aberration and improve appearance of the imaging sensor.

In an embodiment of the present disclosure, an imaging sensor is provided, including: a substrate; a plurality of pixel units disposed on the substrate, the plurality of pixel units being configured to acquire an optical signal carrying imaging information and convert the optical signal into an electric pixel signal, and arranged in array to form a pixel array; a plurality of bias voltage pseudo pixel units disposed around the pixel array, the plurality of bias voltage pseudo pixel units being connected with the plurality of pixel units, and configured to provide a bias voltage to the plurality of pixel units; and at least one touch sensing pseudo pixel unit disposed at one side of the plurality of bias voltage pseudo pixel units which is away from the plurality of pixel units, the at least one touch sensing pseudo pixel unit being configured to form a capacitor structure to sense a touch to form an electric touch signal.

Optionally, the imaging sensor may further include: a driving circuit disposed on the substrate, the driving circuit being connected with the plurality of pixel units, and configured to generate a drive signal which is capable of making the electric pixel signal be read, wherein the at least one touch sensing pseudo pixel unit is disposed between the driving circuit and the plurality of bias voltage pseudo pixel units.

Optionally, the imaging sensor may further include: a plurality of scanning lines which connect the driving circuit with the plurality of pixel units and are configured to transmit the drive signal, the plurality of scanning lines being extending along a first direction, wherein the at least one touch sensing pseudo pixel unit includes a plurality of touch sensing pseudo pixel units, and the touch sensing pseudo pixel units arranged in the first direction are connected.

Optionally, the imaging sensor may further include: a pixel reading circuit disposed on the substrate, the pixel reading circuit being connected with the plurality of pixel units and configured to read the electric pixel signal, wherein the at least one touch sensing pseudo pixel unit is disposed between the pixel reading circuit and the plurality of bias voltage pseudo pixel units.

Optionally, the imaging sensor may further include: a plurality of pixel data lines which connect the pixel reading circuit with the plurality of pixel units and are configured to transmit the electric pixel signal, the plurality of pixel data lines extending along a second direction, wherein the at least one touch sensing pseudo pixel unit includes a plurality of touch sensing pseudo pixel units, and the touch sensing pseudo pixel units arranged in the second direction are connected.

Optionally, the imaging sensor may further include: a plurality of pixel data lines disposed on the substrate, the plurality of pixel data lines being connected with the plurality of pixel units, being configured to transmit the electric pixel signal which is read by a pixel reading circuit, extending along a second direction, and being connected with the pixel reading circuit at one side of the pixel array, wherein the at least one touch sensing pseudo pixel unit is disposed on the other side of the pixel array in the second direction.

Optionally, the at least one touch sensing pseudo pixel unit may include a plurality of touch sensing pseudo pixel units arranged in array to form a touch sensing array, wherein the touch sensing pseudo pixel units in a same row are connected, or the touch sensing pseudo pixel units in a same column are connected, or the touch sensing pseudo pixel units in a same row are connected and the touch sensing pseudo pixel units in a same column are connected.

Optionally, the imaging sensor may further include: at least one touch sensing data line disposed on the substrate, the at least one touch sensing data line being connected with the at least one touch sensing pseudo pixel unit and configured to transmit the electric touch signal read by a touch sensing reading circuit which is connected with the at least one touch sensing pseudo pixel unit via the at least one touch sensing data line.

Optionally, the at least one touch sensing pseudo pixel unit may include a plurality of touch sensing pseudo pixel units arranged in array to form a touch sensing array, wherein the plurality of touch sensing pseudo pixel units in the touch sensing array are connected, and the touch sensing array is connected with the touch sensing reading circuit via the touch sensing data line.

Optionally, the pixel unit may include a photodiode and a switching device connected with the photodiode, and the photodiode includes a photosensitive region for acquiring an optical signal, wherein the bias voltage pseudo pixel unit includes a first light absorbing conductive structure and a pseudo switch connected with the first light absorbing conductive structure, the first light absorbing conductive structure includes a first light absorbing region, and a projection of the first light absorbing region on a surface of the substrate is same as a projection of the photosensitive region on the surface of the substrate, wherein the touch sensing pseudo pixel unit includes a second light absorbing conductive structure, the second light absorbing conductive structure includes a second light absorbing region, and a projection of the second light absorbing region on the surface of the substrate is same as the projection of the photosensitive region on the surface of the substrate.

Optionally, the imaging sensor may further include: a scanning line disposed on the substrate and extending along a first direction, the scanning line being configured to transmit a drive signal which is capable of making the electric pixel signal be read; and a pixel data line disposed on the substrate and extending along a second direction, the pixel data line being configured to transmit the electric pixel signal, wherein the photodiode includes a bottom electrode on the substrate, a diode on the bottom electrode, and a top electrode on the diode; the switching device includes a gate connected with the scanning line, a source connected with the bottom electrode, a drain connected with the pixel data line, and a semiconductor layer connected with the source and the drain and disposed at a position above the gate; the first light-absorbing conductive structure includes a first middle conductive layer on the substrate, a first light absorbing layer on the first middle conductive layer, and a first upper conductive layer on the first light absorbing layer, a projection of the first middle conductive layer on the surface of the substrate is same as a projection of the bottom electrode on the surface of the substrate, and a projection of the first light absorbing layer on the surface of the substrate is same as a projection of the diode on the surface of the substrate, and a projection of the first upper conductive layer on the surface of the substrate is same as a projection of the top electrode on the surface of the substrate; the pseudo switch includes a pseudo gate connected with the scanning line, a pseudo source connected with the first middle conductive layer, and a pseudo channel layer connected with the pseudo source and disposed at a position above the pseudo gate, wherein a projection of the pseudo gate on the surface of the substrate is same as a projection of the gate on the surface of the substrate, a projection of the pseudo source on the surface of the substrate is same as a projection of the source on the surface of the substrate, and a projection of the pseudo channel layer on the surface of the substrate is same as a projection of the semiconductor layer on the surface of the substrate; and the second light absorbing conductive structure includes a second middle conductive layer on the substrate, a second light absorbing layer on the second middle conductive layer, and a second upper conductive layer on the second light absorbing layer, and a projection of the second light absorbing layer on the surface of the substrate is same as the projection of the diode on the surface of the substrate.

Optionally, bottom electrodes of photodiodes in adjacent pixel units may be electrically insulated from each other, and the imaging sensor may further include: a bias voltage connection line for connecting adjacent bias voltage pseudo pixel units, the bias voltage connection line being connected with the first middle conductive layer of the first light absorbing conductive structure in the bias voltage pseudo pixel unit; and a touch sensing connection line for connecting adjacent touch sensing pseudo pixel units, the touch sensing connection line being connected with the second middle conductive layer of the second light absorbing conductive structure in the touch sensing pseudo pixel unit.

Optionally, the imaging sensor may further include: a connecting layer disposed on the pixel array and electrically connected with the top electrode via a first though hole, the connecting layer extending on the plurality of bias voltage pseudo pixel units and being electrically connected with the first upper conductive layer via a second through hole.

Optionally, the imaging sensor may further include: a dielectric layer disposed on the substrate, wherein the photodiode is disposed on the dielectric layer; and in the switching device, the gate is disposed between the substrate and the dielectric layer, and the source, the drain and the semiconductor layer are disposed on the dielectric layer; the first light absorbing conductive structure is disposed on the dielectric layer, the pseudo gate is disposed between the substrate and the dielectric layer, and the pseudo source and the pseudo channel layer are disposed on the dielectric layer; the second light absorbing conductive structure is disposed on the dielectric layer; the pixel unit further includes a storage electrode disposed between the dielectric layer and the substrate, the storage electrode and the bottom electrode being used to form a storage capacitor; the bias voltage pseudo pixel unit further includes a first lower conductive layer disposed between the dielectric layer and the substrate, a projection of the first lower conductive layer on the surface of the substrate being same as a projection of the storage electrode on the surface of the substrate, and the first lower conductive layer being in contact with the first middle conductive layer through a third through hole penetrating through the dielectric layer; and the touch sensing pseudo pixel unit further includes a second lower conductive layer disposed between the dielectric layer and the substrate, a projection of the second lower conductive layer on the surface of the substrate being same as the projection of the storage electrode on the surface of the substrate.

Optionally, the at least one touch sensing pseudo pixel unit may include a first touch sensing pseudo pixel unit with a fourth through hole and a second touch sensing pseudo pixel unit without a fourth through hole, and the second lower conductive layer of the first touch sensing pseudo pixel unit is connected with the second middle conductive layer via the fourth through hole.

Optionally, the touch sensing pseudo pixel units arranged in the first direction may be connected; and the first touch sensing pseudo pixel unit is disposed at one side of the connected second touch sensing pseudo pixel unit which is close to the pixel array, or the first touch sensing pseudo pixel unit is disposed at one side of the connected second touch sensing pseudo pixel unit which is away from the pixel array, or the first touch sensing pseudo pixel unit is disposed at one side of the connected second touch sensing pseudo pixel unit which is close to the pixel array and at one side of the connected second touch sensing pseudo pixel unit which is away from the pixel array.

Optionally, the imaging sensor may further include: a plurality of pseudo data lines disposed in the second direction, the pseudo data lines being disposed between adjacent second touch sensing pseudo pixel units and between adjacent scanning lines, and being parallel to the pixel data lines, and line width of the pseudo data lines is equal to line width of the pixel data lines.

Optionally, a region surrounded by a projection of the scanning line on the surface of the substrate and a projection of the pixel data line on the surface of the substrate is a pixel area, a region surrounded by a projection of the scanning line on the surface of the substrate and a projection of the pseudo data line on the surface of the substrate is a touch sensing pseudo pixel area, and a projection of the pixel unit in the pixel area is same as a projection of the second touch sensing pseudo pixel unit in the touch sensing pseudo pixel area.

Optionally, the bottom electrode of the photodiode, and the source, the drain, the gate and the semiconductor layer of the switching device may be used to form a light shielding laminated layer; and a projection of the second middle conductive layer of the second light absorbing conductive structure in the touch sensing pseudo pixel area is same as a projection of the light shielding laminated layer in the pixel area.

Optionally, an area of a projection of the at least one touch sensing pseudo pixel unit on the surface of the substrate may be within a range from 1 m$^2$ to 30 mm$^2$.

Optionally, the imaging sensor may be a fingerprint imaging sensor, and the plurality of pixel units may be configured to acquire an optical signal carrying fingerprint information.

In an embodiment of the present disclosure, an imaging module is provided, including: the above imaging sensor; and a shell with a through hole which exposes the plurality of pixel units, the plurality of bias voltage pseudo pixel units and the at least one touch sensing pseudo pixel unit.

Embodiments of the present disclosure may provide following advantages. In embodiments of the present disclosure, the bias voltage pseudo pixel units which have a structure similar to that of the pixel units are used to provide the bias voltage to the pixel units, and the touch sensing pseudo pixel unit which has a structure similar to that of the pixel units are used to sense a touch. As having the similar structure with the pixel units, the bias voltage pseudo pixel units and the touch sensing pseudo pixel unit are also capable of absorbing light. Compared with the existing solutions where a metal or transparent oxide conductor is used to form a bias voltage ring and a touch layer, embodiments of the present disclosure may effectively reduce color aberration between the bias voltage pseudo pixel units and the touch sensing pseudo pixel unit and the pixel units, and improve appearance of the imaging sensor.

In some embodiments, the pixel unit includes the photodiode on the substrate and the photodiode includes the photosensitive region for collecting the optical signal. The bias voltage pseudo pixel unit includes the first light absorbing conductive structure on the substrate, and the first light absorbing conductive structure includes the first light absorbing region. The touch sensing pseudo pixel unit includes the second light absorbing conductive structure on the substrate, and the second light absorbing conductive structure includes the second light absorbing region. The first light absorbing region, the second light absorbing region and the photosensitive region have the same projection on the surface of the substrate. By setting the projection of the first light absorbing region and the projection of the second light absorbing region on the surface of the substrate to be the same as the projection of the photosensitive region on the surface of the substrate, similarity between act of the bias voltage pseudo pixel units and the touch sensing pseudo pixel unit on light and act of the pixel units on light may be improved, color aberration between the bias voltage pseudo pixel units and the touch sensing pseudo pixel unit and the pixel units may be reduced, and appearance of the imaging sensor may be improved.

In some embodiments, the region surrounded by the projection of the scanning line on the surface of the substrate and the projection of the pixel data line on the surface of the substrate is the pixel area, the region surrounded by the projection of the scanning line on the surface of the substrate and the projection of the pseudo data line or the touch sensing data line on the surface of the substrate is a touch sensing pseudo pixel area, and the projection of the pixel unit in the pixel area is the same as the projection of the second touch sensing pseudo pixel unit in the touch sensing pseudo pixel area. By setting the projection of the second touch sensing pseudo pixel unit in the touch sensing pseudo pixel area to be the same as the projection of the pixel unit in the pixel area, light may be blocked by the second touch sensing pseudo pixel unit, so that color aberration between the bias voltage pseudo pixel units and the touch sensing pseudo pixel unit and the pixel units may be reduced, and appearance of the imaging sensor may be improved.

In some embodiments, the photodiode includes the bottom electrode, the diode, and the top electrode, the switching device includes the gate, the source, the drain and the semiconductor layer, and the first light absorbing conductive structure in the bias voltage pseudo pixel unit includes the first middle conductive layer, the first light absorbing layer and the first upper conductive layer, the pseudo switch includes the pseudo gate, the pseudo source and the pseudo channel layer, and the second light absorbing conductive structure in the touch sensing pseudo pixel unit includes the second middle conductive layer, the second light absorbing layer and the second upper conductive layer. As having the similar structure with the pixel units, the bias voltage pseudo pixel units and the touch sensing pseudo pixel unit may be formed by a same process with the pixel units, which may reduce process procedures and manufacturing cost, and does not require much modification to existing production lines, and extra processes and cost.

DETAILED DESCRIPTION

As described in the background, in the existing techniques, the imaging sensor with a touch wake-up function has color aberration. Reasons for the color aberration are analyzed below in conjunction with a structure of an existing touch wake-up imaging sensor.

Figure 1:
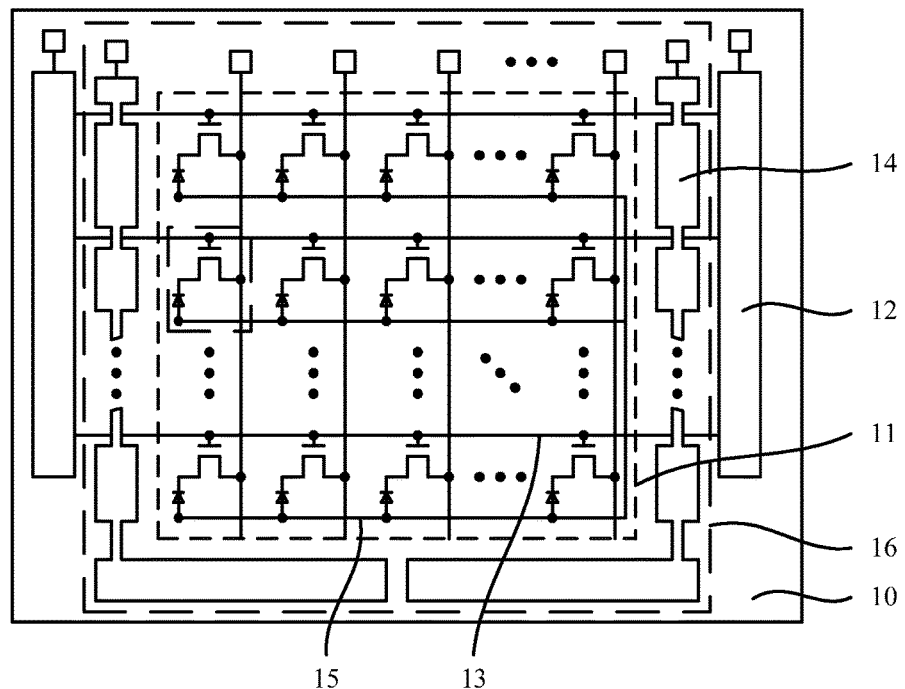
FIG. 1 schematically illustrates a structural diagram of a touch wake-up imaging sensor in existing techniques.

FIG. 1 schematically illustrates a structural diagram of the touch wake-up imaging sensor in existing techniques.

Referring to FIG. 1, the imaging sensor includes: a substrate 10; a pixel array 11 on the substrate 10, including pixel units arranged in array for converting optical signals carrying fingerprint information into electric signals; a driving circuit 12 on the substrate 10 for generating a drive signal capable of making the electric signals be read; a plurality of scanning lines 13 disposed on the substrate 10, connecting the driving circuit 12 with the pixel units, and configured to transmit the driving signal; and a touch layer 14 disposed on the substrate 10 and serving as a plate of a capacitor structure to sense a touch, the touch layer 14 being disposed between the driving circuit 12 and the pixel array 11.

When fingerprint detection is performed, a capacitance value between the touch layer 14 and the ground is changed before or after the touch layer 14 is touched. By sensing the change of the capacitance value, whether the touch layer 14 is touched can be determined, so that the touch wake-up function is achieved.

The imaging sensor is an optical imaging sensor, the pixel unit includes a photoelectric device for converting the optical signal carrying the fingerprint information into the electrical signal, and a switching device connected with the photoelectric device. In the imaging sensor shown in FIG. 1, the photoelectric device is an amorphous silicon photodiode, and the switching device is an amorphous silicon thin film transistor.

The imaging sensor further includes a bias voltage ring 15 disposed on the substrate 10. The bias voltage ring 15 is connected with the photoelectric devices in the pixel units, and configured to apply a bias voltage signal to the photoelectric devices.

When the imaging sensor is used to form an imaging module, the substrate 10 of the imaging sensor includes a viewing region 16, and the pixel array 11, the bias voltage ring 15 and the touch layer 14 may be all disposed on the substrate 10 at the viewing region 16.

The imaging module further includes a protective shell (not shown). The shell has a through hole thereon exposing the viewing region 16 of the substrate 10. Therefore, when the imaging sensor is applied to a mobile phone or other electronic devices, components on the substrate 10 at the viewing region 16 may become a part of appearance of the electronic device.

As the pixel units are used for converting an optical signal into an electric signal, that is, the pixel unit absorbs the optical signal and converts it into a corresponding amount of electric signal, the pixel array 11 has an absorption effect on light. The bias voltage ring 15 and the touch layer 14 are usually a metal or transparent oxide conductor, thus, the bias voltage ring 15 and the touch layer 14 have a reflection or transmission effect on light. The different effects on light by the pixel array 11, the bias voltage ring 15 and the touch layer 14 result in color aberration among the pixel array 11, the bias voltage ring 15 and the touch layer 14, thereby affecting the appearance of the imaging module.

Therefore, embodiments of the present disclosure provide an imaging sensor, including: a substrate; a plurality of pixel units disposed on the substrate, the plurality of pixel units being configured to acquire an optical signal carrying imaging information and convert the optical signal into an electric pixel signal, and arranged in array to form a pixel array; a plurality of bias voltage pseudo pixel units disposed around the pixel array, the plurality of bias voltage pseudo pixel units being connected with the plurality of pixel units, and configured to provide a bias voltage to the plurality of pixel units; and at least one touch sensing pseudo pixel unit disposed at one side of the plurality of bias voltage pseudo pixel units which is away from the plurality of pixel units, the at least one touch sensing pseudo pixel unit being configured to form a capacitor structure to sense a touch to form an electric touch signal.

Embodiments of the present disclosure may provide following advantages. In embodiments of the present disclosure, the bias voltage pseudo pixel units which have a structure similar to that of the pixel units are used to provide the bias voltage to the pixel units, and the touch sensing pseudo pixel unit which has a structure similar to that of the pixel units are used to sense a touch. As having the similar structure with the pixel units, the bias voltage pseudo pixel units and the touch sensing pseudo pixel unit are also capable of absorbing light. Compared with the existing solutions where a metal or transparent oxide conductor is used to form a bias voltage ring and a touch layer, embodiments of the present disclosure may effectively reduce color aberration between the bias voltage pseudo pixel units and the touch sensing pseudo pixel unit and the pixel units, and improve appearance of the imaging sensor.

In order to clarify the object, characteristic and advantages of embodiments of the present disclosure, embodiments of present disclosure will be described clearly in detail in conjunction with accompanying drawings.

Figure 2:
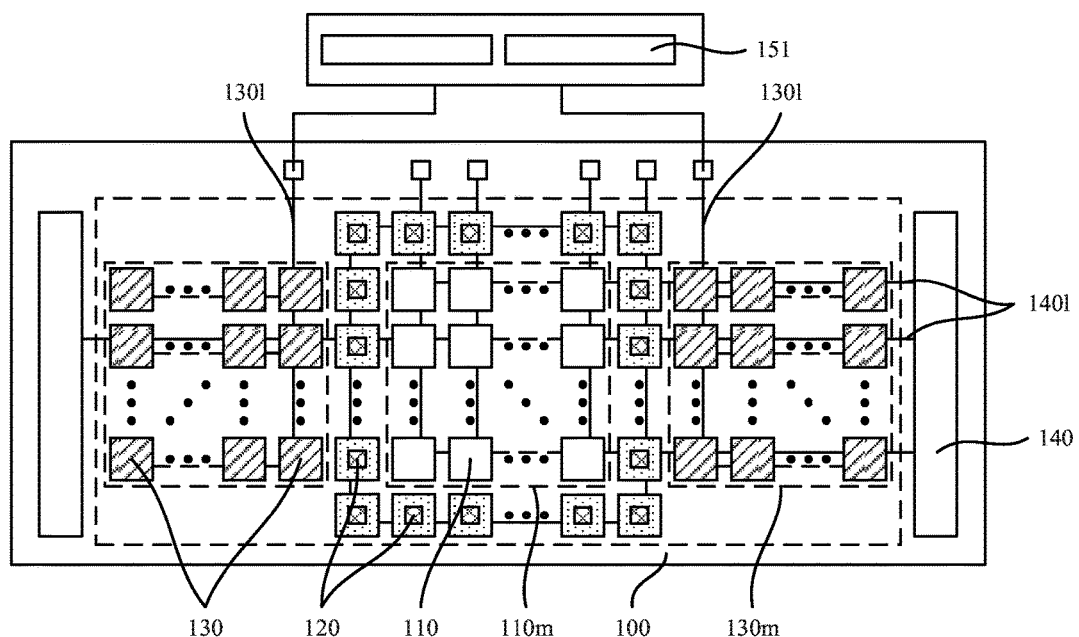
FIG. 2 schematically illustrates a top view of an imaging sensor according to an embodiment.

FIG. 2 schematically illustrates a top view of an imaging sensor according to an embodiment.

Referring to FIG. 2, the imaging sensor includes: a substrate 100; a plurality of pixel units 110 disposed on the substrate 100, the plurality of pixel units 110 being configured to acquire an optical signal carrying imaging information and convert the optical signal into an electric pixel signal, and arranged in array to form a pixel array 110$m$; a plurality of bias voltage pseudo pixel units 120 disposed around the pixel array 110$m$, the plurality of bias voltage pseudo pixel units 120 being connected with the plurality of pixel units 110, and configured to provide a bias voltage to the plurality of pixel units 110; and at least one touch sensing pseudo pixel unit 130 disposed at one side of the plurality of bias voltage pseudo pixel units 120 which is away from the plurality of pixel units 110, the at least one touch sensing pseudo pixel unit 130 being configured to form a capacitor structure to sense a touch to form an electric touch signal.

As having the similar structure with the pixel units 110, the bias voltage pseudo pixel units 120 and the touch sensing pseudo pixel unit 130 are also capable of absorbing light. Therefore, the bias voltage pseudo pixel units 120 are used instead of the bias voltage ring, and the touch sensing pseudo pixel unit 130 is used instead of the touch layer. In this way, the bias voltage for the pixel units can be provided, a touch can be sensed, color aberration between the bias voltage pseudo pixel units and the touch sensing pseudo pixel unit and the pixel units may be reduced, and appearance of the imaging sensor may be improved.

In some embodiments, the imaging sensor may be a fingerprint imaging sensor for acquiring a fingerprint image, and the plurality of pixel units 110 may be configured to acquire an optical signal carrying fingerprint information and convert the optical signal into an electric signal to acquire the fingerprint image. In some embodiments, the imaging sensor may be other types of imaging sensor.

The substrate 100 provides an operating platform for a manufacturing process. In some embodiments, a material of the substrate 100 may be glass. The advantage of using the glass substrate 100 to form the imaging sensor includes low manufacturing cost and good insulating property of the glass substrate 100. The low cost may reduce cost of the imaging sensor, and the good insulating property may avoid interference between the pixel units 110 on the substrate 100 to improve a signal to noise ratio and performance of the imaging sensor.

It should be noted that, using glass as the material of the substrate is merely an example. In some embodiments, the substrate may be made of other transparent materials, such as organic glass or transparent glass fiber polyester plate, which is not limited.

The pixel units 110 are arranged in array for forming the pixel array 110*m*. The pixel array 110*m* is configured to collect an optical signal and convert the optical signal into an electric pixel signal. Specifically, in some embodiments, the imaging sensor is a fingerprint imaging sensor, so the pixel units 110 are configured to acquire an optical signal carrying fingerprint information and convert the optical signal into an electric pixel signal.

The bias voltage pseudo pixel units 120 are connected with the pixel units 110 for providing a bias voltage to the pixel units 110. In some embodiment, the plurality of bias voltage pseudo pixel units 120 are arranged around the pixel array 110*m* to form a ring shape surrounding the pixel array 110*m*.

The touch sensing pseudo pixel units 130 are used to form a capacitor structure to sense a touch to form a touch electric signal. Specifically, in some embodiments, during fingerprint sensing, the touch sensing pseudo pixel unit 130 functions as one plate of the capacitor and a finger serves as the other plate. By sensing a capacitance change between the touch sensing pseudo pixel unit 130 and the ground, a touch may be sensed, so as to form the touch electric signal. The touch sensing pseudo pixel units 130 are disposed at one side of the bias voltage pseudo pixel units 120 which is away from the pixel units 110.

Optionally, an area of a projection of the at least one touch sensing pseudo pixel unit 130 on a surface of the substrate 100 may be within a range from 1 mm$^2$ to 30 mm$^2$. If the total area of the projection of the at least one touch sensing pseudo pixel unit 130 on the surface of the substrate 100 is too large, an area of the imaging sensor may be too large, which may affect an integration level of the imaging sensor. If the total area of the projection of the at least one touch sensing pseudo pixel unit 130 on the surface of the substrate 100 is too small, an area of the capacitor structure formed by the at least one touch sensing pseudo pixel unit 130 may be too small, which may affect sensing sensitivity of the touch sensing pseudo pixel unit 130 on the touch.

Referring to FIG. 2, in some embodiments, the imaging sensor may further include: a driving circuit 140 disposed on the substrate 100, the driving circuit 140 being connected with the plurality of pixel units 110, and configured to generate a drive signal which is capable of making the electric pixel signal be read, wherein the at least one touch sensing pseudo pixel unit 130 is disposed between the driving circuit 140 and the plurality of bias voltage pseudo pixel units 120.

Specifically, a row direction of the pixel array 110*m* is a first direction, and a column direction of the pixel array 110*m* is a second direction. Two driving circuits 140 are disposed on the substrate 100 and at two sides of the pixel array 110*m* in the first direction. The number of the at least one touch sensing pseudo pixel units 130 is more than one, and the plurality of touch sensing pseudo pixel units 130 are arranged in array to form the touch array 130*m*. In some embodiments, the plurality of touch sensing pseudo pixel units 130 on the substrate 100 form two touch arrays 130*m* disposed on two sides of the pixel array 110*m* in the first direction respectively, and between the driver circuit 140 and the bias voltage pseudo pixel units 120.

The imaging sensor may further include: a plurality of scanning lines which connect the driving circuit 140 with the plurality of pixel units 110 and are configured to transmit the drive signal, the plurality of scanning lines being extending along the first direction, wherein the touch sensing pseudo pixel units 130 arranged in the first direction are connected.

As the driving circuits 140 are disposed on two sides of the pixel array 110*m* in the first direction, the scanning lines 140*l* extend in the first direction to achieve the connection between the driving circuits 140 and the pixel units 110. Besides, as the touch sensing pseudo pixel units 130 are disposed between the pixel array 110*m* and the driving circuit 140, in some embodiments, the touch sensing pseudo pixel units 130 arranged in the first direction are connected to reduce parasitic capacitance of the imaging sensor, so as to improve performance of the imaging sensor.

Specifically, the touch sensing pseudo pixel units 130 in the touch array 130*m* are arranged in the same row as the pixel units 110 in the pixel array 110*m*, so that the touch sensing pseudo pixel units 130 disposed in the same row are connected.

The imaging sensor may further include: at least one touch sensing data line 130*l* disposed on the substrate 100, the at least one touch sensing data line 130*l* being connected with the at least one touch sensing pseudo pixel unit 130 and configured to transmit the electric touch signal read by a touch sensing reading circuit 151 which is connected with the at least one touch sensing pseudo pixel unit 130 via the at least one touch sensing data line 130*l*.

In some embodiments, the touch sensing data line 130*l* extends in a second direction perpendicular to the first direction and is connected to a row of touch sensing pseudo pixel units 130 which is closest to the pixel array 110*m*. As the touch sensing pseudo pixel units 130 in the same row in the touch sensing array 130*m* are connected, the plurality of touch sensing pseudo pixel units 130 in one touch sensing array 130*m* are connected via the touch sensing data line 130*l*, and are connected with the touch sensing read circuit 151 via the touch sensing data line 130*l*.

Specifically, two touch sensing data lines 130*l* are respectively disposed on two sides of the pixel array 130*m* in the first direction. The touch sensing pseudo pixel units 130 in the two touch sensing arrays 130*m* are respectively connected via two touch sensing data lines 130*l* so as to achieve the connection with the touch sensing read circuit 151.

Figure 3:
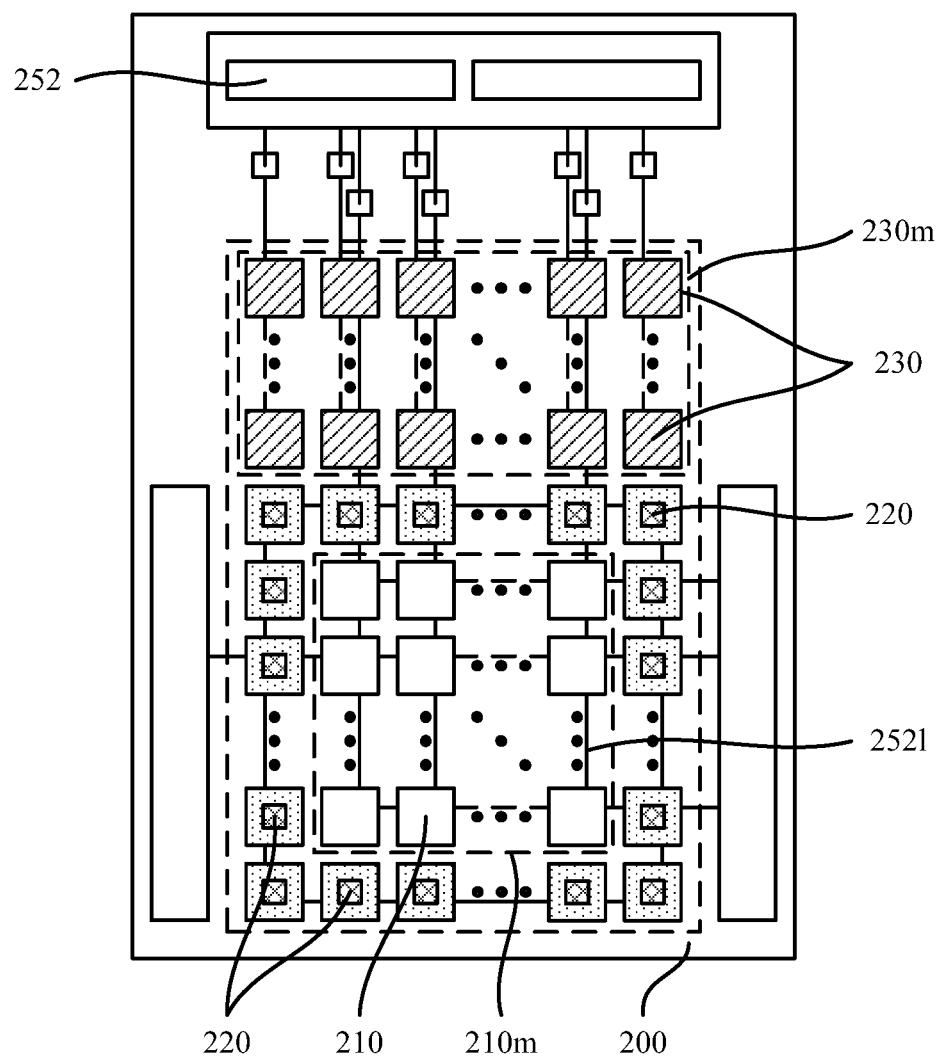
FIG. 3 schematically illustrates a top view of an imaging sensor according to an embodiment.

FIG. 3 schematically illustrates a top view of an imaging sensor according to an embodiment.

Referring to FIG. 3, the imaging sensor further includes a pixel reading circuit 252 disposed on the substrate 200, the pixel reading circuit 252 being connected with the plurality of pixel units 210 and configured to read the electric pixel signal, wherein the at least one touch sensing pseudo pixel unit 230 is disposed between the pixel reading circuit 252 and the plurality of bias voltage pseudo pixel units 220.

Specifically, a row direction of the pixel array 210*m* is a first direction, and a column direction of the pixel array 210*m* is a second direction. A pixel reading circuit 252 is disposed on the substrate 200 and at one side of the pixel array 210*m* in the second direction. The plurality of touch sensing pseudo pixel units 230 form one touch sensing array 230*m* which is disposed at one side of the pixel array 210*m* in the second direction and between the pixel reading circuit 252 and the bias voltage pseudo pixel units 220.

The imaging sensor may further include a plurality of pixel data lines 252*l* which connect the pixel reading circuit 252 with the plurality of pixel units 210 and are configured to transmit the electric pixel signal, the plurality of pixel data lines 252*l* extending along the second direction, wherein the touch sensing pseudo pixel units 230 arranged in the second direction are connected.

As the pixel reading circuit 252 is disposed at one side of the pixel array 210*m* in the second direction, the scanning lines 252*l* extend in the second direction to achieve the connection between the pixel reading circuit 252 and the pixel units 210. Besides, as the touch sensing pseudo pixel units 230 are disposed between the pixel array 110*m* and the pixel reading circuit 252, in some embodiments, the touch sensing pseudo pixel units 230 arranged in the second direction are connected to reduce parasitic capacitance of the imaging sensor, so as to improve performance of the imaging sensor.

Figure 4:
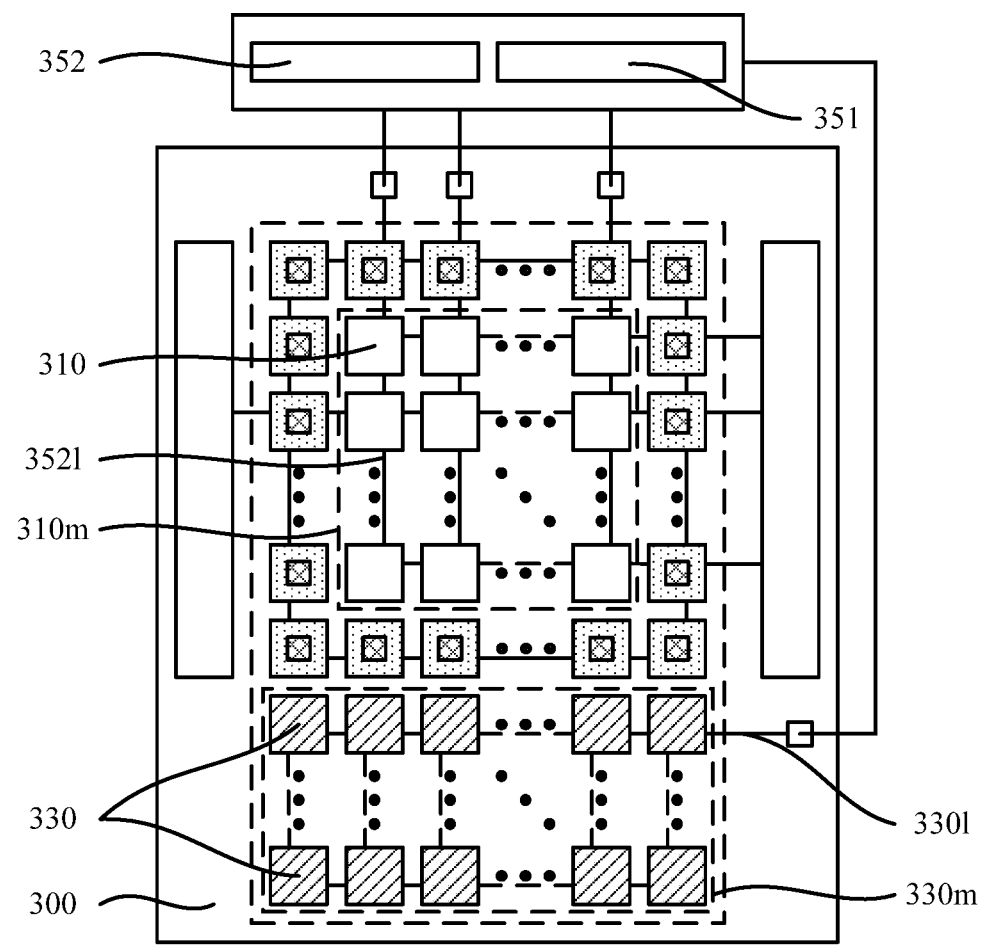
FIG. 4 schematically illustrates a top view of an imaging sensor according to an embodiment.

Specifically, the touch sensing pseudo pixel units 230 in the touch array 230*m* are arranged in the same row as the pixel units 210 in the pixel array 210*m*, so that the touch sensing pseudo pixel units 230 disposed in the same row are connected, FIG. 4 schematically illustrates a top view of an imaging sensor according to an embodiment.

In the embodiment, the imaging sensor may further include: a plurality of pixel data lines 352*l* disposed on the substrate 30, the plurality of pixel data lines 352*l* being connected with the plurality of pixel units 310, being configured to transmit the electric pixel signal which is read by a pixel reading circuit 352, extending along a second direction, and being connected with the pixel reading circuit 352 at one side of the pixel array 310*m*, wherein the at least one touch sensing pseudo pixel unit 330 is disposed on the other side of the pixel array 310*m* in the second direction.

Specifically, a row direction of the pixel array 310*m* is the first direction, and a column direction of the pixel array 310*m* is the second direction. The pixel data line 352*l* extends in the second direction and is connected with a connection pad (not shown in FIG. 4) on the substrate 300 at one side of the pixel array 310*m*. The pixel reading circuit 352 is connected with the pixel data lines 352*l* via the connection pad, so as to read the electric pixel signal.

The touch sensing pseudo pixel unit 330 is disposed at one side of the pixel array 310*m* which is away from the connection pad in the second direction. That is, the pixel array 310*m* is disposed between the touch sensing pseudo pixel units 330 and the connection pad.

In some embodiments, the touch sensing pseudo pixel units 330 are arranged in array on the substrate 300 to form a touch sensing array 330*m*. Therefore, the touch sensing array 330*m* is disposed at one side of the pixel array 310*m* which is away from the connection pad in the second direction.

In some embodiments, in the touch sensing array 330*m*, the touch sensing pseudo pixel units 330 in a same row are connected, and the touch sensing pseudo pixel units 330 in a same column are connected. The touch sensing array 330*m* is connected with a connection pad (not shown in FIG. 4) via the touch sensing data line 330*l*, and the touch sensing reading circuit 351 is connected with the touch sensing data line 330*l* via the connection pad so as to read the electric touch signal.

In the above embodiment, the touch sensing pseudo pixel units 330 in a same row are connected, and the touch sensing pseudo pixel units 330 in a same column are connected. It should be noted that the above embodiment is just one exemplary implementation. In some embodiments, the touch sensing pseudo pixel units in a same row are connected, or the touch sensing pseudo pixel units in a same column are connected. If the touch sensing pseudo pixel units in a same row are connected, they are connected with a connection pad via the touch sensing data line, and the touch sensing reading circuit is connected with the corresponding touch sensing data line via the connection pad so as to read the electric touch signal generated by the touch sensing pseudo pixel units in the row. If the touch sensing pseudo pixel units in a same column are connected, they are connected with a connection pad via the touch sensing data line, and the touch sensing reading circuit is connected with the corresponding touch sensing data line via the connection pad so as to read the electric touch signal generated by the touch sensing pseudo pixel units in the column.

FIGS. 5 to 15 schematically illustrate structural diagrams of an imaging sensor according to an embodiment.

Figure 5:
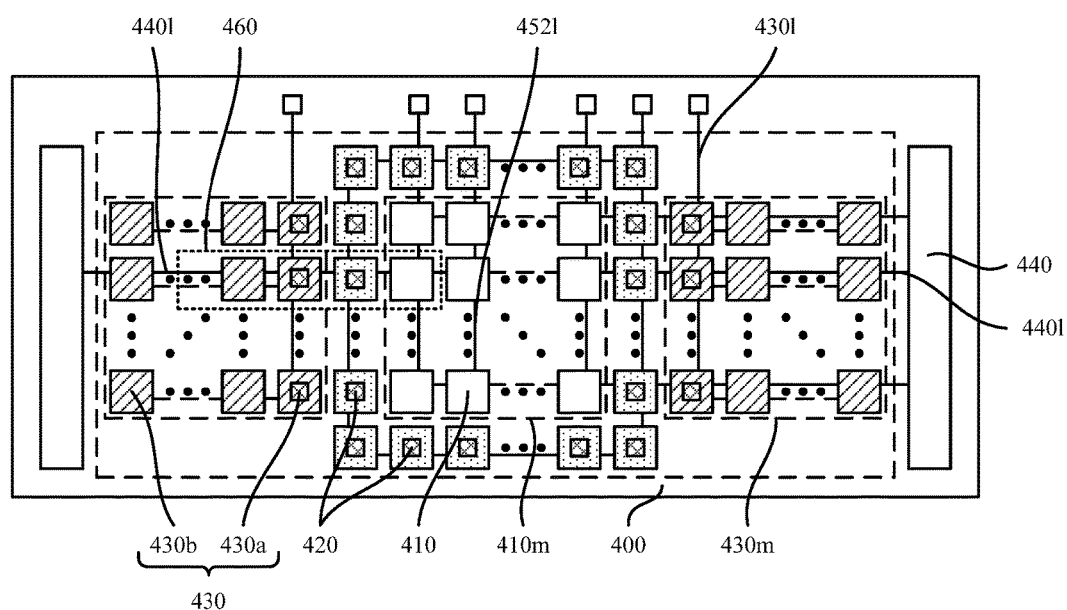
FIG. 5 schematically illustrates a top view of an imaging sensor according to an embodiment.

FIG. 5 schematically illustrates a top view of the imaging sensor.

Referring to FIG. 5, the pixel units 410 form a pixel array 410*m*. The driving circuit 440 is disposed on two sides of the pixel array 410*m* in the first direction. The bias voltage pseudo pixel units 420 are arranged in a ring shape and around the pixel array 410*m* to surround the pixel array 410*m*. The touch sensing pseudo pixel units 430 form a touch sensing array 430*m* which is disposed between the bias voltage pseudo pixel units 420 arranged in a ring shape and the driving circuit 440.

The imaging sensor may further include a plurality of scanning lines 440*l* extending along a first direction on the substrate 400 and configured to transmit a drive signal which is capable of making the electric pixel signal be read.

The imaging sensor may further include: a plurality of pixel data lines 452*l* extending along a second direction on the substrate 400 and configured to transmit the electric pixel signal. The pixel data line 452*l* is connected with a connection pad (not shown in FIG. 5) at one side of the pixel array 410*m* in the second direction, for connecting with the pixel reading circuit.

In some embodiments, the first direction is parallel to a row direction of the pixel array 410m, and the second direction is parallel to a column direction of the pixel array 410m. Therefore, the first direction is perpendicular to the second direction. However, the present invention is not limited thereto.

Figure 6:
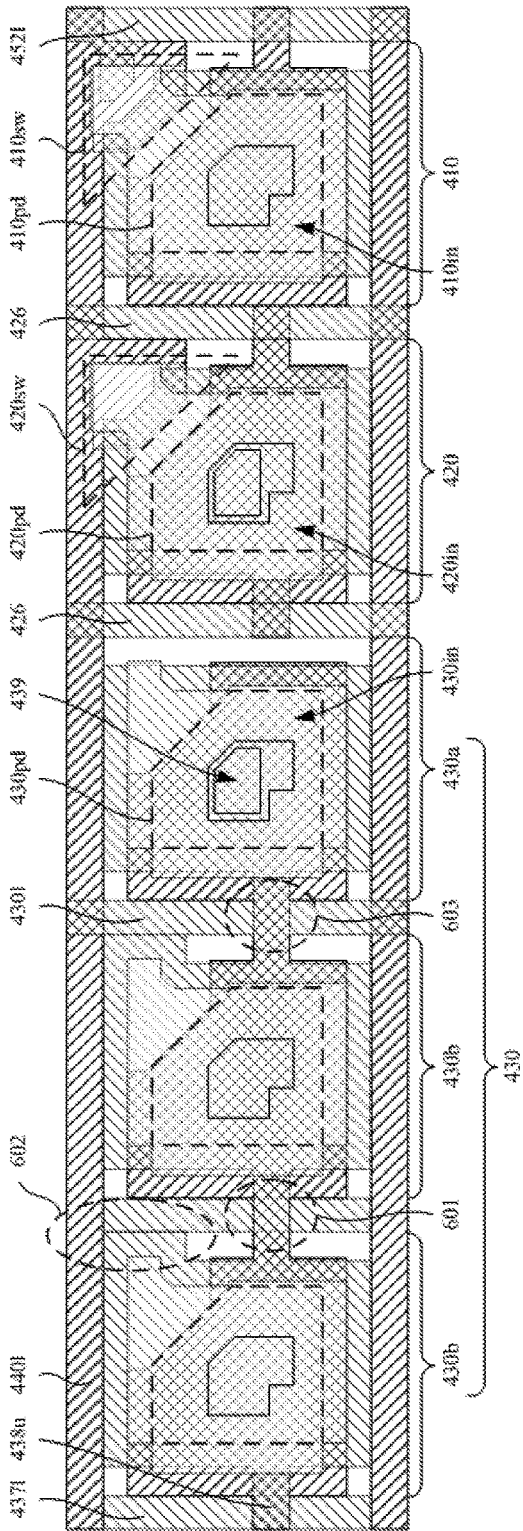
FIG. 6 schematically illustrates an enlarged view of a structure in a box 460 in the embodiment shown in FIG. 5.

FIG. 6 schematically illustrates an enlarged view of a structure in a box 460 in the embodiment shown in FIG. 5.

Each pixel unit 410 includes a photodiode 410pd and a switching device 410sw connected with the photodiode 410pd, and the photodiode 410pd includes a photosensitive region 410in for acquiring an optical signal. Each bias voltage pseudo pixel unit 420 includes a first light absorbing conductive structure 420pd and a pseudo switch 420sw connected with the first light absorbing conductive structure 420pd, the first light absorbing conductive structure 420pd includes a first light absorbing region 420in, and a projection of the first light absorbing region 420in on a surface of the substrate 400 (referring to FIG. 5) is same as a projection of the photosensitive region 410in on the surface of the substrate 400. Each touch sensing pseudo pixel unit 430 includes a second light absorbing conductive structure 430pd, the second light absorbing conductive structure 430pd includes a second light absorbing region 430in, and a projection of the second light absorbing region 430in on the surface of the substrate 400 is same as the projection of the photosensitive region 410in on the surface of the substrate 400.

By setting the projection of the first light absorbing region 420in and the projection of the second light absorbing region 430in on the surface of the substrate 400 to be the same as the projection of the photosensitive region 410in on the surface of the substrate 400, similarity between act of the bias voltage pseudo pixel units 420 and the touch sensing pseudo pixel units 430 on light and act of the pixel units 410 on light may be improved, color aberration between the bias voltage pseudo pixel units 420 and the touch sensing pseudo pixel units 430 and the pixel units 410 may be reduced, and appearance of the imaging sensor may be improved.

The photodiode 410pd is configured to acquire an optical signal and convert the optical signal into an electric signal. In some embodiments, the imaging sensor is a fingerprint imaging sensor, and the photodiode 410pd acquires an optical signal carrying fingerprint information and converts the optical signal into an electric pixel signal.

The photosensitive region 410in is an optical signal acquisition region of the photodiode 410pd. Light incident on the photosensitive region 410in is acquired by the photodiode 410pd.

The switching device 410sw is configured to control the output of electric signals generated by the photodiode 410pd. In some embodiments, the switching device 410sw is configured to control connectivity between the photodiode 410pd and the pixel data line 452l under the control of the driving signal, so as to implement the read of the electric pixel signal.

Figure 7:
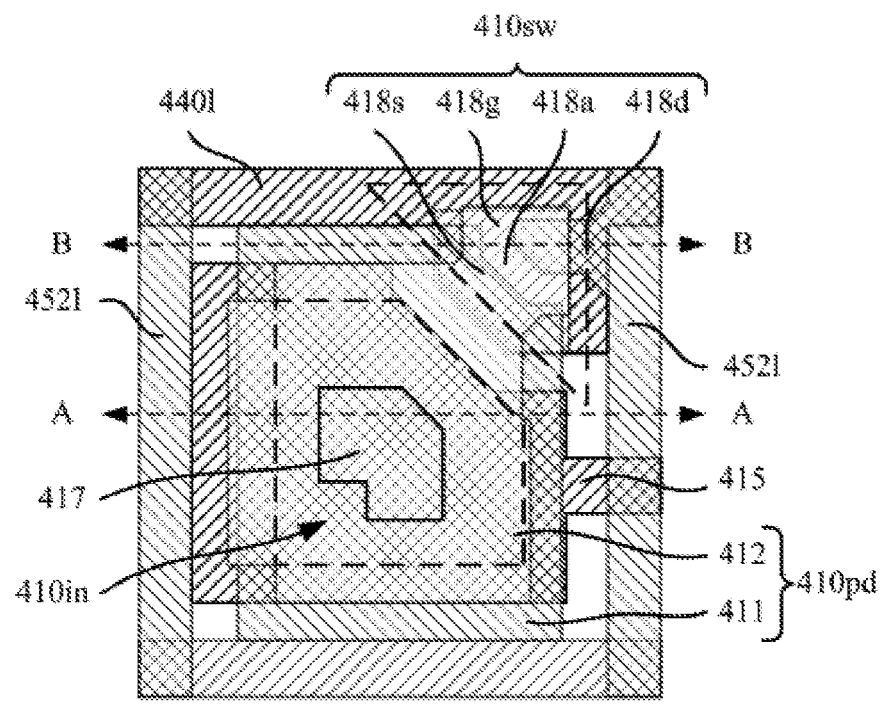
FIG. 7 schematically illustrates a top view of a pixel unit 410 in the embodiment shown in FIG. 6.
Figure 8:
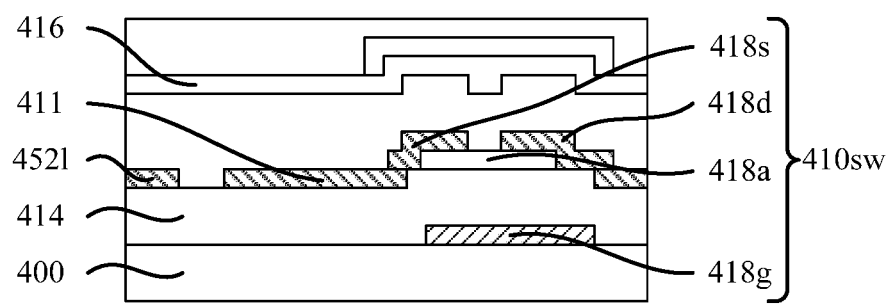
FIG. 8 schematically illustrates a sectional view of the embodiment shown in FIG. 7 along an AA line.
Figure 9:
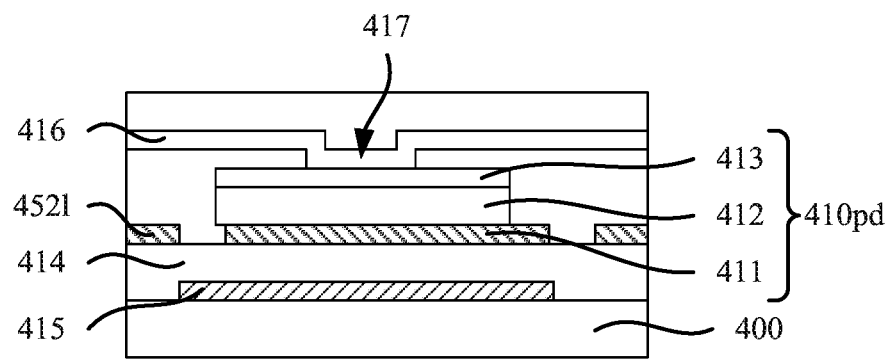
FIG. 9 schematically illustrates a sectional view of the embodiment shown in FIG. 7 along a BB line.

Referring to FIGS. 6 to 9, FIG. 7 schematically illustrates a top view of a pixel unit 410 in the embodiment shown in FIG. 6, FIG. 8 schematically illustrates a sectional view of the embodiment shown in FIG. 7 along an AA line, and FIG. 9 schematically illustrates a sectional view of the embodiment shown in FIG. 7 along a BB line.

The photodiode 410pd includes a bottom electrode 411 on the substrate 400, a diode 412 on the bottom electrode 411, and a top electrode 413 on the diode 412.

The top electrode 413 and the bottom electrode 411 are used for loading a bias voltage which enables the photodiode 410pd to be reverse-biased. The diode 412 is configured to acquire an optical signal and make the acquired optical signal be converted into a corresponding electric pixel signal whose strength is related to strength of the acquired optical signal. In some embodiments, the bottom electrode 411 of the photodiode 410pd is further configured to output the electric pixel signal.

Specifically, the photodiode 410pd may be an amorphous silicon photodiode to control cost and reduce process difficulty. However, in some embodiments, the photodiode may be other types of photodiodes.

Referring to FIGS. 8 and 9, in order to apply the bias voltage to the photodiode 410pd, the imaging sensor further includes a connection layer 416 on the pixel array 410m, and the connection layer 416 is electrically connected with the top electrode 413 via the first through hole 417.

Specifically, the substrate 400 further includes an isolation layer (not shown in figures) formed thereon, and the photodiode 410pd is disposed in the isolation layer. The first through hole 417 is disposed in the isolation layer on the photodiode 410pd, the bottom of the first through hole 417 exposes the top electrode 413. The connection layer 416 is disposed on the isolation layer, covers bottom of the first through hole 417, and is in contact with the top electrode 413 at the bottom of the first through hole 417 to achieve electrical connection. It should be noted that, in FIG. 7, the top electrode 413 and above structures are omitted for clarity of illustration.

In addition, as the bottom electrode 411 is also configured to output the electric pixel signal, in the pixel array 410m, the bottom electrodes 411 of the photodiodes 410pd in adjacent pixel units 410 are electrically insulated from each other, so as to avoid a short circuit between the adjacent pixel units 410 to reduce interference. Specifically, as shown in FIG. 7, the bottom electrode 411 is disposed between adjacent scanning lines 440l, and the bottom electrode 411 has an interval with the adjacent pixel data lines 452l.

The switching device 410sw includes a gate 418g connected with the scanning line 440l, a source 418s connected with the bottom electrode 411, a drain 418d connected with the pixel data line 452l, and a semiconductor layer 418a connected with the source 418s and the drain 418d and disposed at a position above the gate 418g.

The source 418s is connected with the bottom electrode 411 of the photodiode 410pd and configured to input the electric signal generated by the photodiode 410pd. The drain 418d is connected with the pixel data line 452l and configured to output the electric signal generated by the photodiode 410pd when the switching device 410sw is turned on, so that the electric signal is read. The semiconductor layer 418a is a channel layer. When the switching device is turned on, a channel is formed in the semiconductor layer 418a so as to realize connectivity between the source 418s and the drain 418d. The gate 418g is connected with the scanning line 440l, and configured to receive a drive signal transmitted by the scanning line 440l and enable a channel to be formed in the semiconductor layer 418a under the control of the drive signal, so as to realize the connectivity between the source 418s and the drain 418d and the read of the electric signal.

Specifically, the switching device 410sw is an amorphous silicon thin film transistor (TFT), thus, a material of the semiconductor layer 418a is amorphous silicon to control cost and reduce difficulty of processes. In addition, as the photodiode 410pd is an amorphous silicon photodiode, using an amorphous silicon thin film transistor as the switching device 410sw may also improve compatibility of the switching device 410*sw* and the photodiode 410*pd*, thereby reducing process difficulty, improving yield, and reducing manufacturing cost.

Referring to FIGS. 8 and 9, it should be noted that, the connection layer 416 extends onto the switch device 410*sw*, thus, the isolation layer also extends onto the switch device 410*sw* to achieve electrical isolation between the connection layer and the switching devices 410*sw*, which prevents a short circuit.

In addition, the imaging sensor may further include a light shielding layer (not shown in figures) on the connection layer 416. The light shielding layer is disposed at a position corresponding to the switch device 410*sw*, to reduce possibility of light radiation to the switching device 410*sw*, avoid degradation of a function of the switch device 410*sw* and prolong a service life of the imaging sensor.

Referring to FIGS. 8 and 9, the imaging sensor may further include a dielectric layer 414 on the substrate 400. The photodiode 410*pd* is disposed on the dielectric layer 414, that is, the dielectric layer 414 is disposed on the substrate 400, the bottom electrode 411 is disposed on the dielectric layer 414, the diode 412 is disposed on the bottom electrode 411, and the top electrode 413 is disposed on the diode 412.

It should be noted that, the scanning line 440*l* is disposed between the substrate 400 and the dielectric layer 414, and the pixel data line 452*l* is disposed on the dielectric layer 414. The scanning line 440*l* and the pixel data line 452*l* are respectively disposed on upper and lower sides of the dielectric layer 414, so as to achieve insulation between the scanning line 440*l* and the pixel data line 452*l* and prevent interference between the drive signal and the electric pixel signals.

In the switching device 410*sw*, the gate 418*g* is disposed between the substrate 400 and the dielectric layer 414, and the source 418*s*, the drain 418*d* and the semiconductor layer 418*a* are disposed on the dielectric layer 414. The dielectric layer 414 is further used to achieve electrical isolation between the gate 418*g* in the switching device 410*sw* and the channel of the switching device 410*sw* in the semiconductor layer 418*a*.

The pixel unit 410 further includes a storage electrode 415 disposed between the dielectric layer 414 and the substrate 400. The storage electrode 415 and the bottom electrode 411 form a first storage capacitor (not shown in figures).

Referring to FIGS. 6 and 10 to 12, the first light absorbing conductive structure 420*pd* is configured to absorb light. Besides, the first light absorbing conductive structure 420*pd* is connected with the pixel unit 410 to further realize conduction to apply a bias voltage to the pixel unit 410. In some embodiments, the first light absorbing conductive structure 420*pd* is connected with the top electrode 413 of the photodiode 410*pd* in the pixel unit 410 and configured to apply a bias voltage to the photodiode 410*pd*.

The first light absorbing region 420*in* is a light absorbing region of the first light absorbing conductive structure 420*pd*, and light incident on the first light absorbing region 420*in* is absorbed by the first light absorbing conductive structure 420*pd*.

The pseudo switch 420*sw* is configured to block light and reduce light leakage, so as to reduce color aberration between the bias voltage pseudo pixel units 420 and the pixel units 410. In addition, the pseudo switch 420*sw* is also used for realizing electrical isolation between the first light absorbing conductive structure 420*pd* and the pixel data line 452*l* to reduce interference.

Figure 10:
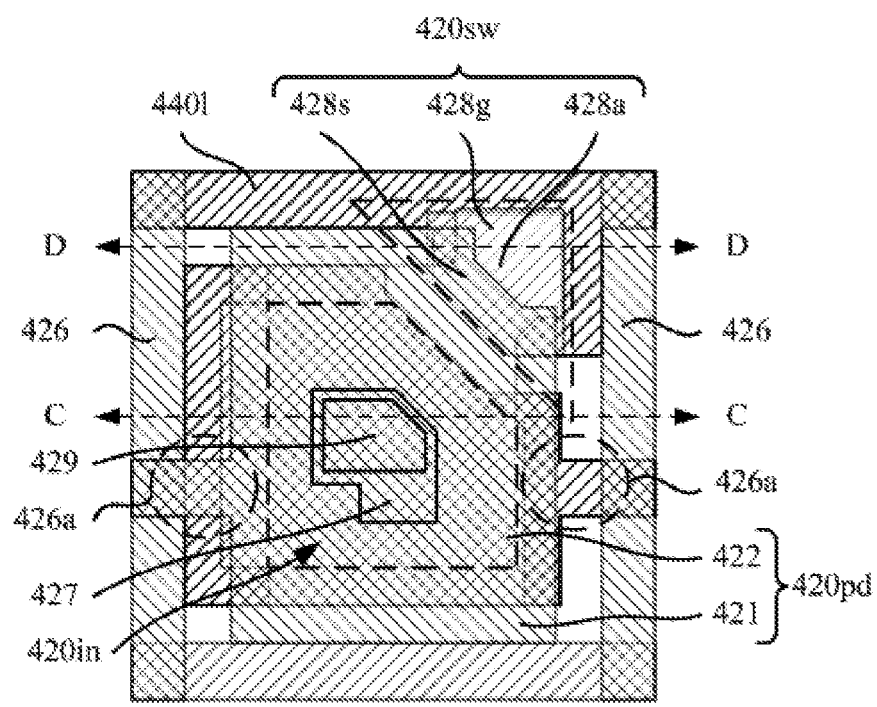
FIG. 10 schematically illustrates a top view of a bias voltage pseudo pixel unit 420 in the embodiment shown in FIG. 6.
Figure 11:
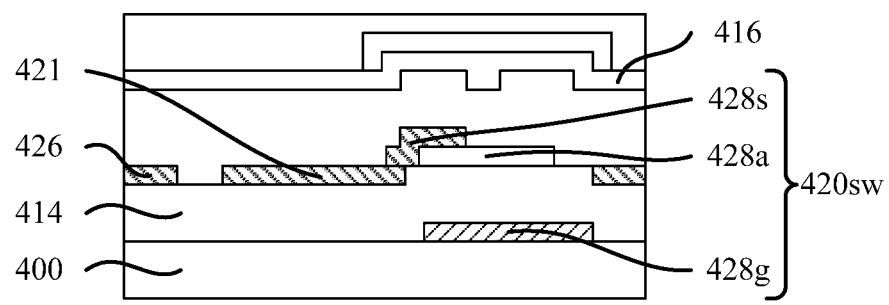
FIG. 11 schematically illustrates a sectional view of the embodiment shown in FIG. 10 along a CC line.
Figure 12:
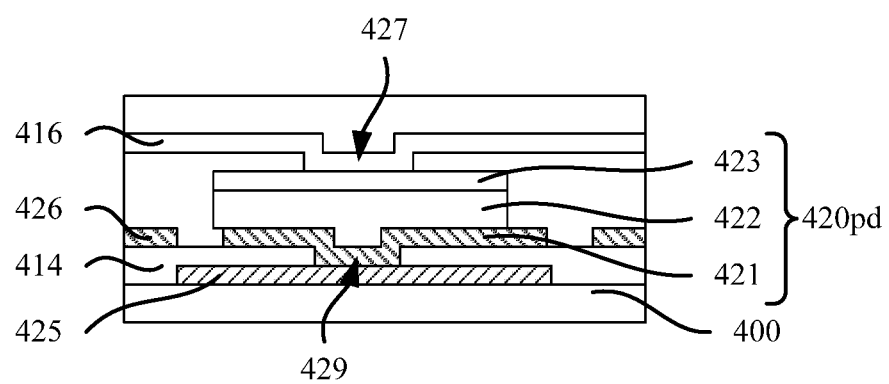
FIG. 12 schematically illustrates a sectional view of the embodiment shown in FIG. 10 along a DD line.

Specifically, referring to FIGS. 10 to 12, FIG. 10 schematically illustrates a top view of a bias voltage pseudo pixel unit 420 in the embodiment shown in FIG. 6, FIG. 11 schematically illustrates a sectional view of the embodiment shown in FIG. 10 along a CC line, and FIG. 12 schematically illustrates a sectional view of the embodiment shown in FIG. 10 along a DD line.

In the above embodiments, the first light absorbing conductive structure 420*pd* has the same structure with the photodiode 410*pd*, so that the light absorbing effect of the bias voltage pseudo pixel units 420 is similar to the light absorbing effect of the pixel units 410 to reduce color aberration between the bias voltage pseudo pixel units 420 and the pixel units 410.

In some embodiments, the first light absorbing conductive structure 420*pd* includes a first middle conductive layer 421 on the substrate 400, a first light absorbing layer 422 on the first middle conductive layer 421, and a first upper conductive layer 423 on the first light absorbing layer 422, a projection of the first middle conductive layer 421 on the surface of the substrate 400 is same as a projection of the bottom electrode 411 (referring to FIGS. 7 to 9) on the surface of the substrate 400, and a projection of the first light absorbing layer 422 on the surface of the substrate 400 is same as a projection of the diode 412 (referring to FIGS. 7 to 9) on the surface of the substrate 400, and a projection of the first upper conductive layer 423 on the surface of the substrate 400 is same as a projection of the top electrode 413 (referring to FIGS. 7 to 9) on the surface of the substrate 400.

The first middle conductive layer 421 of the first light absorbing conductive structure 420*pd* corresponds to the bottom electrode 411 of the photodiode 410*pd*. Therefore, the projection of the first middle conductive layer 421 on the surface of the substrate 400 is the same as the projection of the bottom electrode 411 on the surface of the substrate 400, and the first middle conductive layer 421 and the bottom electrode 411 are formed by a same layer of material.

It should be noted that, as the bottom electrodes 411 of the photodiodes 410*pd* in the adjacent pixel units 410 in the pixel array 410*m* may be electrically insulated from each other, the imaging sensor may further include: a bias voltage connection line for connecting adjacent bias voltage pseudo pixel units 420, the bias voltage connection line being connected with the first middle conductive layer 421 of the first light absorbing conductive structure 420*pd* in the bias voltage pseudo pixel unit 420.

Specifically, referring to FIGS. 10 to 12, in some embodiments, there are two bias voltage connection lines 426 which are respectively disposed at two sides of the bias voltage pseudo pixel unit 420. The bias voltage connection lines 426 and the first middle conductive layer 421 are formed by a same layer of material, and electrically connected by a short line (a structure shown by a circle 426*a* in FIG. 10).

The first light absorbing layer 422 of the first light absorbing conductive structure 420*pd* corresponds to the diode 412 of the photodiode 410*pd*. Therefore, a projection of the first light absorbing layer 422 on the surface of the substrate 400 is the same as a projection of the diode 412 on the surface of the substrate 400, and the first light absorbing layer 422 and the diode 412 are formed by a same layer of material.

The first upper conductive layer 423 of the first light absorbing conductive structure 420*pd* corresponds to the top electrode 413 of the photodiode 410*pd*. Therefore, a projection of the first upper conductive layer 423 on the surface of the substrate 400 is the same as a projection of the top electrode 413 on the surface of the substrate 400, and the first upper conductive layer 423 and the top electrode 413 are formed by a same layer of material.

The first middle conductive layer 421, the first light absorbing layer 422 and the first upper conductive layer 423 of the first light absorbing conductive structure 420pd are disposed to correspond to the bottom electrode 411, the diode 412 and the top electrode 413 of the photodiode 410pd respectively, so that the light absorbing effect of the first light absorbing conductive structure 420pd is as close as possible to the light absorbing effect of the photodiode 410pd, which may minimize color aberration between the bias voltage pseudo pixel units 420 and the pixel units 410. Moreover, the placement also enables the biased voltage pseudo pixel units 420 and the pixel units 410 to be formed by a same process, thereby reducing modification to the existing processes. Accordingly, process cost and manufacturing cost are reduced.

It should be noted that, the imaging sensor further includes a connection layer 416 connected with the top electrode 413 of the photodiode 410pd to apply a bias voltage to the photodiode 410pd. Therefore, referring to FIGS. 10 and 12, the connection layer 416 extends onto the bias voltage pseudo pixel unit 420, and is electrically connected with the first upper conductive layer 423 via the second through hole 427.

Specifically, the isolation layer also extends onto the bias voltage pseudo pixel unit 420, and the first light absorbing conductive structure 420pd is disposed within the isolation layer. The second through hole 427 is disposed in the isolation layer on the first light absorbing conductive structure 420pd, the bottom of the second through hole 427 exposes the first upper conductive layer 423. The connection layer 416 is disposed on the isolation layer, covers the bottom of the second through hole 427, and is in contact with the first upper conductive layer 423 at the bottom of the second through hole 427 for realizing electrical connection. It should be noted that, in FIG. 10, the first upper conductive layer 423 and above structures are omitted for clarity of illustration.

As the first light absorbing conductive structure 420pd is in one-to-one correspondence with each layer of the photodiode 410pd, after the first light absorbing conductive structure 420pd absorbs light, the first light absorbing layer 422 also converts the absorbed light energy into electrical energy so as to generate optical carriers. To prevent the optical carriers generated by the first light absorbing conductive structure 420pd from interfering with the electric pixel signals formed by the pixel units 410, the pseudo switch 420sw and the pixel data line 452l are electrically insulated from each other to avoid output of the optical carriers.

In some embodiments, the pseudo switch 420sw includes a pseudo gate 428g connected with the scanning line 440l, a pseudo source 428s connected with the first middle conductive layer 421, and a pseudo channel layer 428a connected with the pseudo source 428s and disposed at a position above the pseudo gate 428g, wherein a projection of the pseudo gate 428g on the surface of the substrate 400 is same as a projection of the gate 418g (referring to FIGS. 7 to 9) on the surface of the substrate 400, a projection of the pseudo source 428s on the surface of the substrate 400 is same as a projection of the source 418s (referring to FIGS. 7 to 9) on the surface of the substrate 400, and a projection of the pseudo channel layer 428a on the surface of the substrate 400 is same as a projection of the semiconductor layer 418a (referring to FIGS. 7 to 9) on the surface of the substrate 400.

The pseudo gate 428g of the pseudo switch 420sw corresponds to the gate 418g of the switching device 410sw, so that the projection of the pseudo gate 428g on the surface of the substrate 400 is same as the projection of the gate 418g on the surface of the substrate 400, and the pseudo gate 428g and the gate 418g are formed by a same layer of material.

As the pseudo source 428s of the pseudo switch 420sw corresponds to the source 418s of the switching device 410sw, the projection of the pseudo source 428s on the surface of the substrate 400 is same as the projection of the source 418s on the surface of the substrate 400, and the pseudo source 428s and the source 418s are formed by a same layer of material.

The pseudo channel layer 428a of the pseudo switch 420sw corresponds to the semiconductor layer 418a of the switching device 410sw. Therefore, the projection of the pseudo channel layer 428a on the surface of the substrate 400 is same as the projection of the semiconductor layer 418a on the surface of the substrate 400, and the pseudo channel layer 428a and the semiconductor layer 418a are formed by a same layer of material.

Compared with the switching device 410sw (as shown in FIGS. 7 to 9) in the pixel unit 410, the pseudo switch 420sw is not provided with a drain connected with the pixel data line 452l, so as to achieve electrical isolation with the pixel data line 452l, which reduces influence of the formation of the first light absorbing conductive structure 420pd on the electric pixel signal.

Similarly to the pixel unit 410, the connection layer 416 also extends onto the pseudo switch 420sw, thus, the isolation layer also extends onto the pseudo switch 420sw to reduce appearance of a short circuit. In addition, the connection layer 416 may also has a light shielding layer (not shown in figures) disposed thereon. The light shielding layer 416 is disposed at a position corresponding to the pseudo switch 420sw, so that a structure of the bias voltage pseudo pixel unit 420 is close to a structure of the pixel unit 410, which may reduce color aberration between the bias voltage pseudo pixel unit 420 and the pixel unit 410.

The pseudo gate 428g, the pseudo source 428s and the pseudo channel layer 428a of the pseudo switch 420sw are disposed in a one-to-one correspondence with the gate 418g, the source 418s and the semiconductor layer 418a of the switching device 410sw, and drain structures are removed to realize electrical isolation with the pixel data line 452l, so that a structure of the bias voltage pseudo pixel unit 420 may be similar with a structure of the pixel unit 410, which may minimize color aberration between the bias voltage pseudo pixel unit 420 and the pixel unit 410 and enable the biased voltage pseudo pixel unit 420 and the pixel unit 410 to be formed by a same process. In this way, modification to existing processes may be reduced, so as to reduce process cost and manufacturing cost.

Therefore, the dielectric layer 414 on the substrate 400 extends to a position corresponding to the bias voltage pseudo pixel unit 420. As the first middle conductive layer 421, the first light absorbing layer 422 and the first upper conductive layer 423 of the first light absorbing conductive structure 420pd are in one-to-one correspondence with the bottom electrode 411, the diode 412 and the top electrode 413 of the photodiode 410pd, the first light absorbing conductive structure 420pd is also disposed on the dielectric layer 414, that is, the dielectric layer 414 is disposed on the substrate 400, the first middle conductive layer 421 is disposed on the dielectric layer 414, the first light absorbing layer 422 is disposed on the first middle conductive layer 421, and the first upper conductive layer 423 is disposed on the first light absorbing layer 422.

In the pseudo switch 420sw, the pseudo gate 428g is disposed between the substrate 400 and the dielectric layer 414, and the pseudo source 428s and the pseudo channel layer 428a are disposed on the dielectric layer 414.

Similar with the pixel unit 410, the bias voltage pseudo pixel unit 420 further includes a first lower conductive layer 425 disposed between the dielectric layer 414 and the substrate 400, a projection of the first lower conductive layer 425 on the surface of the substrate 400 being same as a projection of the storage electrode 415 on the surface of the substrate 400, and the first lower conductive layer 425 being in contact with the first middle conductive layer 421 through a third through hole 429 penetrating through the dielectric layer 414.

Specifically, the first lower conductive layer 425 corresponds to the storage electrode 415. Therefore, a projection of the first lower conductive layer 425 on the surface of the substrate 400 is same as a projection of the storage electrode 415 on the surface of the substrate 400, and the first lower conductive layer 425 and the storage electrode 415 are formed by a same layer of material.

The third through hole 429 is disposed in and penetrates through the dielectric layer 414 between the first lower conductive layer 425 and the first middle conductive layer 421. Bottom of the third through hole 429 exposes the first lower 113 conductive layer 425, and the first middle conductive layer 421 covers the bottom of the third through hole 429 and is in contact with the first lower conductive layer 425 at the bottom of the third through hole 429 to realize electrical connection.

The electrical connection between the first lower conductive layer 425 and the first middle conductive layer 421 via the third through hole 429 enables the first lower conductive layer 425 to realize a conductive function so as to increase the number of material layers for conduction in the bias voltage pseudo pixel unit 420, effectively reduce resistance of the bias voltage pseudo pixel unit 420, and improve performance of the imaging sensor.

Referring to FIGS. 10 to 12, in some embodiments, in the bias voltage pseudo pixel unit 420, the connection layer 416 realizes electrical connection with the first upper conductive layer 423 via the second through hole 427. The first upper conductive layer 423 and the first middle conductive layer 421 are electrically connected via the first light absorbing layer 422. The first middle conductive layer 421 is electrically connected with the first lower conductive layer 425 via the third through hole 429. Therefore, in one bias voltage pseudo pixel unit 420, all the conductive material films (including the first lower conductive layer 425, the first middle conductive layer 421, the first light absorbing layer 422, the first upper conductive layer 423 and the connection layer 416) are electrically connected along a direction perpendicular to the surface of the substrate 400.

The bias connection lines 426 enable electrical connection between the adjacent first upper conductive layers 423 in the adjacent bias voltage pseudo pixel units 420. Therefore, the conductive material films of all the bias voltage pseudo pixel units 420 are electrically connected. In addition, the bias voltage pseudo pixel unit 420 and the pixel unit 410 are electrically connected via the connection layer 416. Therefore, the plurality of bias voltage pseudo pixel units 420 can replace the bias voltage ring to achieve applying of the bias voltage. Compared with the existing solutions where a metal or transparent oxide conductor is used to form a bias voltage ring and a touch layer, embodiments of the present disclosure may effectively reduce color aberration between the bias voltage pseudo pixel units 420 and the pixel units 410, and improve appearance of the imaging sensor.

Referring to FIGS. 6 and 13 to 15, the second light absorbing conductive structure 430pd is configured to absorb light. During fingerprint sensing, the second light absorbing conductive structure 430pd is further configured to form a capacitor structure to sense a touch.

Specifically, when not being touched, the second light absorbing conductive structure 430pd forms a capacitor structure with the ground; and when being touched, the capacitor structure between the second light absorbing conductive structure 430pd and the ground is formed by a capacitor structure between the two light absorbing conductive structure 430pd and a finger being connected in series with a capacitor structure between a human body and the ground. Therefore, after a touch event, a capacitance value between the second light absorbing conductive structure 430pd and the ground changes. By sensing the change of the capacitance value, it can be determined whether a touch has occurred.

The second light absorbing region 430in is a light absorbing region of the second light absorbing conductive structure 430pd, and light incident on the second light absorbing region 430in is absorbed by the second light absorbing conductive structure 430pd.

Figure 13:
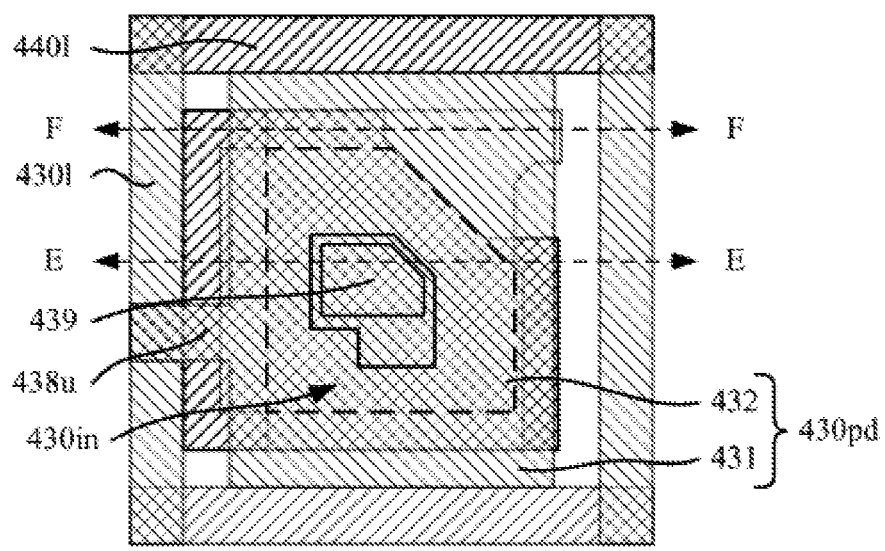
FIG. 13 schematically illustrates a top view of a touch sensing pseudo pixel unit 430 in the embodiment shown in FIG. 6.
Figure 14:
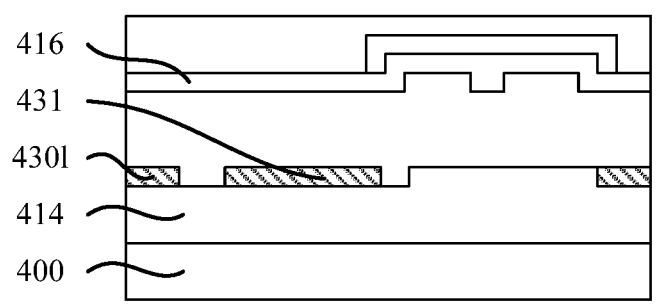
FIG. 14 schematically illustrates a sectional view of the embodiment shown in FIG. 13 along an EE line.
Figure 15:
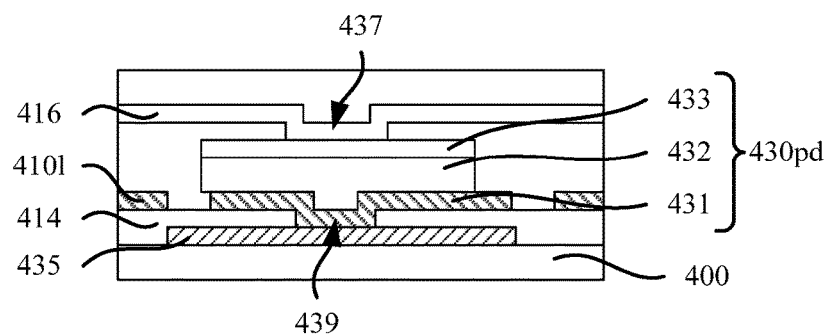
FIG. 15 schematically illustrates a sectional view of the embodiment shown in FIG. 13 along an FF line.

Referring to FIGS. 13 to 15, FIG. 13 schematically illustrates a top view of a touch sensing pseudo pixel unit 430 in the embodiment shown in FIG. 6, FIG. 14 schematically illustrates a sectional view of the embodiment shown in FIG. 13 along an EE line, and FIG. 15 schematically illustrates a sectional view of the embodiment shown in FIG. 13 along an FF line.

In order to make the light absorbing effect of the touch sensing pseudo pixel units 430 close to the light absorbing effect of the pixel units 410 to reduce color aberration between the touch sensing pseudo pixel units 430 and the pixel units 410, in some embodiments, the second light absorbing conductive structure 430pd also has a same structure with the photodiode 410pd.

Specifically, the second light absorbing conductive structure 430pd includes a second middle conductive layer 431 on the substrate 400, a second light absorbing layer 432 on the second middle conductive layer 431, and a second upper conductive layer 433 on the second light absorbing layer 432, and a projection of the second light absorbing layer 432 on the surface of the substrate 400 is same as a projection of the diode 412 (as shown in FIGS. 7 to 9) on the surface of the substrate 400.

The second middle conductive layer 431 of the second light absorbing conductive structure 430pd corresponds to the bottom electrode 411 of the photodiode 410pd. Therefore, a projection of the second middle conductive layer 431 on the surface of the substrate 400 is same as a projection of the bottom electrode 411 on the surface of the substrate 400, and the second middle conductive layer 431 and the bottom electrode 411 are formed by a same layer of material.

It should be noted that, as the bottom electrodes 411 of the photodiodes 410pd in the adjacent pixel units 410 in the pixel array 410m are electrically insulated from each other, the imaging sensor further includes touch sensing connection lines 438u that connects the adjacent touch sensing pseudo pixel units 430. The touch sensing connection lines 438u are connected with the second middle conductive layers 431 of the second light absorbing conductive structures 430pd in the adjacent touch sensing pseudo pixel units 430.

Specifically, in some embodiments, the touch sensing array 430m is disposed on two sides of the pixel array 410m in the first direction, and thus the touch sensing pseudo pixel units 430 arranged in the first direction are connected (as shown in FIG. 5). Therefore, the touch sensing connection lines 438u are in a same layer with the second middle conductive layer 431 and disposed between the adjacent touch sensing pseudo pixel units 430 arranged in the first direction. The touch sensing connection lines 438u extend in the first direction and are parallel to the scanning lines 440l (as shown in FIGS. 6 and 13).

However, a position and a shape of the touch sensing connection lines 438u are related to a connection manner of the touch sensing pseudo pixel units 430. In some embodiments, when the touch sensing pseudo pixel units arranged in the second direction are connected, the touch sensing connection lines may also extend in the second direction and parallel to the pixel data lines.

The second light absorbing layer 432 of the second light absorbing conductive structure 430pd corresponds to the diode 412 of the photodiode 410pd. Therefore, a projection of the second light absorbing layer 432 on the surface of the substrate 400 is same as a projection of the diode 412 on the surface of the substrate 400, and the second light absorbing layer 432 and the diode 412 are formed by a same layer of material.

The second upper conductive layer 433 of the second light absorbing conductive structure 430pd corresponds to the top electrode 413 of the photodiode 410pd. Therefore, a projection of the second upper conductive layer 433 on the surface of the substrate 400 is same as a projection of the top electrode 413 on the surface of the substrate 400, and the second upper conductive layer 433 and the top electrode 413 are formed by a same layer of material.

The second middle conductive layer 431, the second light absorbing layer 432 and the second upper conductive layer 433 of the second light absorbing conductive structure 430pd are disposed in a one-to-one correspondence with the bottom electrode 411, the diode 412 and the top electrode 413 of the photodiode 410pd, which enables the light absorbing effect of the second light absorbing conductive structure 430pd to be as close as possible to the light absorbing effect of the photodiode 410pd, so as to minimize color aberration between the touch sensing pseudo pixel units 430 and the pixel units 410 and the bias voltage pseudo pixel units 420. Further, the placement also enables the touch sensing pseudo pixel units 430, the pixel units 410 and the bias voltage pseudo pixel units 420 to be formed by a same process, which reduces modification to existing processes, process costs and manufacturing costs.

It should be noted that, the connection layer 416 further extends onto the touch sensing pseudo pixel units 430, and the isolation layer also extends onto the touch sensing pseudo pixel units 430. Therefore, in some embodiments, the imaging sensor further includes a connection through hole 437 in the isolation layer. The connection layer 416 and the second upper conductive layer 433 are electrically connected via the connection through hole 437, so that the connection layer 416 together with the second upper conductive layer 433 is used to form a capacitor structure, so as to reduce resistance and improve performance.

Specifically, the second light absorbing conductive structure 430pd is disposed in the isolation layer, the connection through hole 437 is disposed in the isolation layer on the second upper conductive layer 433, and bottom of the connection through hole 437 exposes the second upper conductive layer 433. The connection layer 416 is disposed on the isolation layer, covers the bottom of the connection through hole 437, and is in contact with the second upper conductive layer 433 at the bottom of the connection through hole 437 to achieve electrical connection. It should be noted that, in FIG. 10, the first upper conductive layer 423 and above structures are omitted for clarity of illustration.

In addition, in some embodiments, the dielectric layer 414 also extends to the corresponding position of the touch sensing pseudo pixel unit 430. As the second middle conductive layer 431, the second light absorbing layer 432 and the second upper conductive layer 433 of the second light absorbing conductive structure 430pd are disposed in one-to-one correspondence with the bottom electrode 411, the diode 412 and the top electrode 413 of the photodiode 410pd. Therefore, the second light absorbing conductive structure 430pd is disposed on the dielectric layer 414, that is, the second middle conductive layer 431 is disposed on the dielectric layer 414, the second light absorbing layer 432 is disposed on the second middle conductive layer 431, and the second upper conductive layer 433 is disposed on the second light absorbing layer 432.

The touch sensing pseudo pixel unit 430 further includes a second lower conductive layer 435 disposed between the dielectric layer 414 and the substrate 400, and a projection of the second lower conductive layer 435 on the surface of the substrate 400 is same as a projection of the storage electrode 415 (as shown in FIGS. 7 to 9) on the surface of the substrate 400.

The second lower conductive layer 435 corresponds to the storage electrode 415. Therefore, the projection of the second lower conductive layer 435 on the surface of the substrate 400 is same as the projection of the storage electrode 415 on the surface of the substrate 400, and the second lower conductive layer 435 and the storage electrode 415 are formed by a same layer of material.

To reduce resistance of the touch sensing pseudo pixel unit 430 and improve performance of the touch sensing array 430m formed by the touch sensing pseudo pixel units 430, as shown in FIG. 6, in some embodiments, the touch sensing pseudo pixel unit 430 includes a first touch sensing pseudo pixel unit 430a with a fourth through hole 439 and a second touch sensing pseudo pixel unit 430b not provided with a fourth through hole. FIGS. 13 to 15 illustrate structural diagrams of the first touch sensing pseudo pixel unit 430a in the embodiment shown in FIG. 6.

Specifically, as shown in FIG. 15, in the first touch sensing pseudo pixel unit 430a, the fourth through hole 439 is disposed in the dielectric layer 414 between the second lower conductive layer 435 and the second middle conductive layer 431, and penetrates through the dielectric layer 414. Bottom of the fourth through hole 439 exposes the second lower conductive layer 435. The second middle conductive layer 431 covers the bottom of the fourth through hole 439 and is in contact with the second lower conductive layer 435 at the bottom of the fourth through hole 439 for realizing electrical connection.

The fourth through hole 439 enables electrical connection between the second lower conductive layer 435 and the second middle conductive layer 431, which may reduce the resistance of the touch sensing pseudo pixel unit 430.

However, the arrangement of the fourth through hole 439 may increase difficulty of a manufacturing process of the imaging sensor. That is, the arrangement of the fourth through hole 439 may increase manufacturing cost of the imaging sensor. Therefore, to control cost, the touch sensing pseudo pixel unit 430 further includes the second touch sensing pseudo pixel unit 430b not provided with a fourth through hole.

It should be noted that, as shown in FIG. 6, the second lower conductive layers 435 of the adjacent touch sensing pseudo pixel units 430 are connected by a short line shown in a circle 601, that is, the second lower conductive layers 435 of the adjacent second touch sensing pseudo pixel units 430b are connected, and the second lower conductive layer 435 of the second touch sensing pseudo pixel unit 430b and the second lower conductive layer 435 of the first touch sensing pseudo pixel unit 430b adjacent to the second touch sensing pseudo pixel unit 430b are connected.

In some embodiments, the touch sensing pseudo pixel units 430 arranged in the first direction are connected (as shown in FIG. 5), and the first touch sensing pseudo pixel units 430a are disposed at one side of the connected second touch sensing pseudo pixel units 430b which is close to the pixel array 410m.

Specifically, in some embodiments, the first direction is parallel to a row direction of the touch sensing array 430m, that is, in the touch sensing array 430m, the touch sensing pseudo pixel units 430 disposed in a same row are connected. In the touch sensing pseudo pixel units 430 disposed in the same row, the touch sensing pseudo pixel unit 430 closest to the pixel unit 410 is the first touch sensing pseudo pixel unit 430a with the fourth through hole 439, that is, the first touch sensing pseudo pixel unit 430a is disposed between the second touch sensing pseudo pixel unit 430b and the pixel unit 410.

In some embodiments, the first touch sensing pseudo pixel unit may be disposed at one side of the connected second touch sensing pseudo pixel units which is away from the pixel array. For example, when the first direction is parallel to the row direction of the touch array, the touch sensing pseudo pixel unit furthest away from the pixel unit among the touch sensing pseudo pixel units disposed in the same row is the first touch sensing pseudo pixel unit with the fourth through hole, that is, the second touch sensing pseudo pixel unit is disposed between the first touch sensing pseudo pixel unit and the pixel unit.

In some embodiments, the first touch sensing pseudo pixel units are disposed at one side of the connected second touch sensing pseudo pixel units which is close to the pixel array and the other side of the connected second touch sensing pseudo pixel units which is away from the pixel array. For example, when the first direction is parallel to the row direction of the touch sensing array, the touch sensing pseudo pixel units furthest away from and closest to the pixel unit among the touch sensing pseudo pixel units disposed in the same row are the first touch sensing pseudo pixel units with the fourth through holes, that is, among the touch sensing pseudo pixel units disposed in the same row, at least two ones are the first touch sensing pseudo pixel units, and the second touch sensing pseudo pixel unit is disposed between the two first touch sensing pseudo pixel units.

Still referring to FIG. 6, to make the structure of the touch sensing pseudo pixel unit 430 as similar as possible to the structure of the pixel unit 410, in some embodiments, the imaging sensor further includes a plurality of pieces of pseudo data lines 437l disposed in the second direction. The pseudo data lines 437l are disposed between the adjacent second touch sensing pseudo pixel units 430b and between the adjacent scanning lines 440l, and parallel to the pixel data lines 452l. Line width of the pseudo data lines 437l is equal to line width of the pixel data lines 452l.

The pseudo data lines 437l correspond to the pixel data lines 452l, thus, the line width of the pseudo data lines 437l is equal to the line width of the pixel data lines 452l, and the pseudo data lines 437l and the pixel data lines 452l are formed by a same layer of material.

The pseudo data lines 437l are disposed between adjacent scanning lines 440l. That is, the projection of the pseudo data lines 437l on the surface of the substrate 400 does not overlap the projection of the scanning lines 440l on the surface of the substrate 400. In this way, the structure of the touch sensing array 430m can be made as close as possible to the structure of the pixel array 410m, so as to reduce color aberration between the touch sensing array 430m and the pixel array 410m and minimize parasitic capacitance between the pseudo data lines 437l and the scanning lines 440l. Accordingly, interference of the touch sensing array 430m to the pixel array 410m may be reduced to improve a signal-to-noise ratio of the imaging sensor.

It should be noted that, a region surrounded by a projection of the scanning lines 440l on the surface of the substrate 400 and a projection of the pixel data lines 452l on the surface of the substrate 400 is a pixel area, a region surrounded by the projection of the scanning lines 440l on the surface of the substrate 400 and a projection of the pseudo data lines 437l on the surface of the substrate 400 is a touch sensing pseudo pixel area, and a projection of the pixel units 410 in the pixel area is same as a projection of the second touch sensing pseudo pixel units 430b in the touch sensing pseudo pixel area. The effect of the second touch sensing pseudo pixel units 430b on the light and the effect of the pixel units 410 on the light are similar to reduce color aberration between the touch sensing array 430m and the pixel array 410 m to improve appearance of the imaging sensor.

In some embodiments, in the pixel array 410m, the bottom electrode 411 of the photodiode 410pd, and the source 418s, the drain 418d, the gate 418g and the semiconductor layer 418a of the switching device 410sw may be used to form a light shielding laminated layer (as shown in FIG. 7). In the second touch sensing pseudo pixel unit 430b, a projection of the second middle conductive layer 431 of the second light absorbing conductive structure 430pd in the touch sensing pseudo pixel area is same as a projection of the light shielding laminated layer in the pixel area.

Specifically, as shown in a circle 602 in FIG. 6, the second middle conductive layer 431 has a protrusion, so that a projection of the second middle conductive layer 431 on the surface of the substrate 400 is adjacent to a projection of the pseudo data line 437l on the surface of the substrate 400, which enables the projections of the second middle conductive layer 431 and the pseudo data line 437l to be same as a projection of the light shielding laminated layer on the surface of the substrate 400.

As shown in FIGS. 13 to 15, in some embodiments, in the first touch sensing pseudo pixel unit 430a, the connection layer 416 is electrically connected with the second upper conductive layer 423 via the connection through hole 437; the second upper conductive layer 433 and the second middle conductive layer 431 are electrically connected via the second light absorbing layer 432; the second middle conductive layer 431 is electrically connected with the second lower conductive layer 435 via the fourth through hole 439. Therefore, all the conductive material films in the first touch sensing pseudo pixel unit 430a (including the second lower conductive layer 435, the second middle conductive layer 431, the second light absorbing layer 432, the second upper conductive layer 433 and the connection layer 416) are electrically connected.

Similarly, in the second touch sensing pseudo pixel unit 430b, the connection layer 416 is electrically connected with the second upper conductive layer 433 via the connection through hole 437, and the second upper conductive layer 433 is electrically connected with the second middle conductive layer 431 via the second light absorbing layer 432.

The second lower conductive layers 435 of the adjacent second touch sensing pseudo pixel units 430b are connected though a short line (as shown in the structure of the circle 601 in FIG. 6) and the second lower conductive layer 435 in the second touch sensing pseudo pixel unit 430b is connected with the second lower conductive layer 435 of the first touch sensing pseudo pixel unit 430a which is adjacent to the second touch sensing pseudo pixel unit 430b through a short line (as shown in the structure of a circle 603 in FIG. 6).

The adjacent second touch sensing pseudo pixel units 430b can be electrically connected via the touch sensing connection lines 438u, the second middle conductive layer 431, the second light absorbing layer 432, the second upper conductive layer 433 and the connecting layer 416 can be electrically connected through the touch sensing connection lines 438u, and the second touch sensing pseudo pixel unit 430b and the conductive material film of the first touch sensing pseudo pixel unit 430a can be electrically connected through the touch sensing connection lines 438u. The second lower conductive layers 435 of the adjacent second touch sensing pseudo pixel units 430b may be connected via a short line, and the second lower conductive layer 435 of the second touch sensing pseudo pixel unit 430b may be electrically connected with the second lower conductive layer 435 of the first touch sensing pseudo pixel unit 430a via a short line.

Therefore, in some embodiments, in the touch sensing pseudo pixel units 430 (including the first touch sensing pseudo pixel units 430a and the second touch sensing pseudo pixel units 430b) arranged in the first direction, all the conductive material films are electrically connected.

As shown in FIG. 6, in some embodiments, the imaging sensor further includes a touch sensing data line 430l disposed between the first touch sensing pseudo pixel unit 430a and the second touch sensing pseudo pixel unit 430b. The touch sensing data line 430l is connected with the adjacent first touch sensing pseudo pixel unit 430a and the adjacent second touch sensing pseudo pixel unit 430b and configured to output an electric touch signal.

The touch sensing data line 430l corresponds to the pixel data line 452l. Therefore, the touch sensing data line 430l has line width equal to line width of the pixel data line 452l, and is formed of a same layer of material as the pixel data line 452l.

In some embodiments, the touch sensing data line 430l and the second middle conductive layer 431 are in the same layer, and are adjacent to the second middle conductive layer 431 of the adjacent touch sensing pseudo pixel unit 430 (including the first touch sensing pseudo pixel unit 430a and the second touch sensing pseudo pixel unit 430b). Therefore, in the touch sensing pseudo pixel units 430 (including the first touch sensing pseudo pixel units 430a and the second touch sensing pseudo pixel units 430b) arranged in the first direction, all the conductive material films are electrically connected.

In addition, similar to the pixel data line 452l, the touch sensing data line 430l extends in the second direction and penetrates through the touch sensing array 430m. Therefore, the touch sensing pseudo pixel units 430 disposed on both sides of the touch sensing data line 430l in the second direction can be connected with the touch sensing data line 430l. In the touch sensing array 430m, all the conductive material films of the touch sensing pseudo pixel units 430 can be connected with the touch sensing data line 430l.

In the touch sensing array 430m, as all the conductive material films of the touch sensing pseudo pixel units 430 can be connected with the touch sensing data line 430l, a laminated structure formed by all the conductive material films of the touch sensing pseudo pixel units 430 can replace a touch layer, to realize touch sensing to form an electric touch signal. Compared with the existing solutions where a metal or transparent oxide conductor is used to form a bias voltage ring and a touch layer, embodiments of the present disclosure may reduce color aberration between the touch sensing pseudo pixel unit 430 and the pixel units 410, and effectively improve appearance of the imaging sensor.

Accordingly, in an embodiment of the present disclosure, an imaging module is provided.

Figure 16:
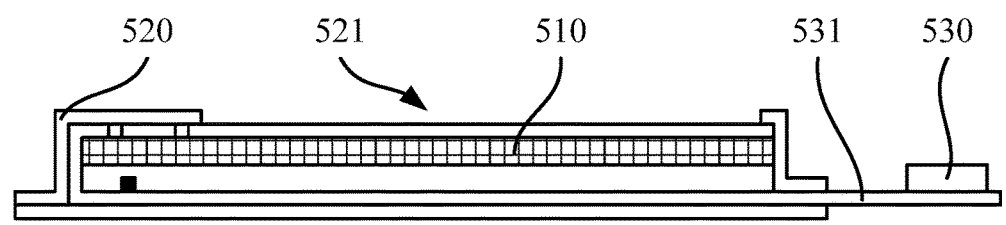
FIG. 16 schematically illustrates a structural diagram of an imaging module according to an embodiment.

FIG. 16 schematically illustrates a structural diagram of an imaging module according to an embodiment.

The imaging module includes the imaging sensor 510 provided in above embodiments; and a shell 520 with a through hole 521 which exposes the plurality of pixel units, the plurality of bias voltage pseudo pixel units and the at least one touch sensing pseudo pixel unit.

More details about the imaging sensor 510 can be found in the descriptions of the above embodiments, and are not described in detail here.

The shell 520 may protect or support the imaging sensor 510.

In some embodiments, the shell 520 is a shell of the imaging module. In some embodiments, the shell may be a shell of an electronic device provided with the imaging module.

The shell 520 has the through hole 521 thereon which penetrates through the shell 520. The through hole 521 exposes the pixel units, the bias voltage pseudo pixel units, and the touch sensing pseudo pixel unit. As color aberration between the bias voltage pseudo pixel units and the touch sensing pseudo pixel unit and the pixel units is relatively small, a part exposed by the through hole 521 has relatively good color uniformity, which is beneficial to improve appearance of the imaging module or appearance of the electronic device provided with the imaging module.

It should be noted that, in some embodiments, the imaging module further includes: a peripheral circuit 530 connected with the imaging sensor 510, and a circuit board 531 for electrically connecting the imaging sensor 510 with the peripheral circuit 530. The peripheral circuit 530 includes a detection unit which is connected with the touch sensing pseudo pixel unit and configured to sense a capacitance value between the touch sensing pseudo pixel unit and the ground and control the pixel units to acquire an optical signal and convert the optical signal into an electric signal when the capacitance value changes. The circuit board 531 may include a printed circuit board or a flexible circuit board.

From above, in embodiments of the present disclosure, the bias voltage pseudo pixel units which have a structure similar to that of the pixel units are used to provide the bias voltage to the pixel units, and the touch sensing pseudo pixel unit which has a structure similar to that of the pixel units are used to sense a touch. As having the similar structure with the pixel units, the bias voltage pseudo pixel units and the touch sensing pseudo pixel unit are also capable of absorbing light. Compared with the existing solutions where a metal or transparent oxide conductor is used to form a bias voltage ring and a touch layer, embodiments of the present disclosure may effectively reduce color aberration between the bias voltage pseudo pixel units and the touch sensing pseudo pixel unit and the pixel units, and improve appearance of the imaging sensor. Further, in some embodiments, the pixel unit includes the photodiode on the substrate and the photodiode includes the photosensitive region for collecting the optical signal. The bias voltage pseudo pixel unit includes the first light absorbing conductive structure on the substrate, and the first light absorbing conductive structure includes the first light absorbing region. The touch sensing pseudo pixel unit includes the second light absorbing conductive structure on the substrate, and the second light absorbing conductive structure includes the second light absorbing region. The first light absorbing region, the second light absorbing region and the photosensitive region have the same projection on the surface of the substrate. By setting the projection of the first light absorbing region and the projection of the second light absorbing region on the surface of the substrate to be the same as the projection of the photosensitive region on the surface of the substrate, similarity between act of the bias voltage pseudo pixel units and the touch sensing pseudo pixel unit on light and act of the pixel units on light may be improved, color aberration between the bias voltage pseudo pixel units and the touch sensing pseudo pixel unit and the pixel units may be reduced, and appearance of the imaging sensor may be improved. Further, in some embodiments, the region surrounded by the projection of the scanning line on the surface of the substrate and the projection of the pixel data line on the surface of the substrate is the pixel area, the region surrounded by the projection of the scanning line on the surface of the substrate and the projection of the pseudo data line or the touch sensing data line on the surface of the substrate is a touch sensing pseudo pixel area, and the projection of the pixel unit in the pixel area is the same as the projection of the second touch sensing pseudo pixel unit in the touch sensing pseudo pixel area. By setting the projection of the second touch sensing pseudo pixel unit in the touch sensing pseudo pixel area to be the same as the projection of the pixel unit in the pixel area, light may be blocked by the second touch sensing pseudo pixel unit, so that color aberration between the bias voltage pseudo pixel units and the touch sensing pseudo pixel unit and the pixel units may be reduced, and appearance of the imaging sensor may be improved. Further, in some embodiments, the photodiode includes the bottom electrode, the diode, and the top electrode, the switching device includes the gate, the source, the drain and the semiconductor layer, and the first light absorbing conductive structure in the bias voltage pseudo pixel unit includes the first middle conductive layer, the first light absorbing layer and the first upper conductive layer, the pseudo switch includes the pseudo gate, the pseudo source and the pseudo channel layer, and the second light absorbing conductive structure in the touch sensing pseudo pixel unit includes the second middle conductive layer, the second light absorbing layer and the second upper conductive layer. As having the similar structure with the pixel units, the bias voltage pseudo pixel units and the touch sensing pseudo pixel unit may be formed by a same process with the pixel units, which may reduce process procedures and manufacturing cost, and does not require much modification to existing production lines, and extra processes and cost.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. An imaging sensor, comprising:
    a substrate;
    a plurality of pixel units disposed on the substrate, the plurality of pixel units being configured to acquire an optical signal carrying imaging information and convert the optical signal into an electric pixel signal, and arranged in array to form a pixel array;
    a plurality of bias voltage pseudo pixel units disposed around the pixel array, the plurality of bias voltage pseudo pixel units being connected with the plurality of pixel units, and configured to provide a bias voltage to the plurality of pixel units; and
    at least one touch sensing pseudo pixel unit disposed at one side of the plurality of bias voltage pseudo pixel units which is away from the plurality of pixel units, the at least one touch sensing pseudo pixel unit being configured to form a capacitor structure to sense a touch to form an electric touch signal.

2. The imaging sensor according to claim 1, further comprising:
    a driving circuit disposed on the substrate, the driving circuit being connected with the plurality of pixel units, and configured to generate a drive signal which is capable of making the electric pixel signal be read, wherein the at least one touch sensing pseudo pixel unit is disposed between the driving circuit and the plurality of bias voltage pseudo pixel units.

3. The imaging sensor according to claim 2, further comprising:
    a plurality of scanning lines which connect the driving circuit with the plurality of pixel units and are configured to transmit the drive signal, the plurality of scanning lines being extending along a first direction,
    wherein the at least one touch sensing pseudo pixel unit comprises a plurality of touch sensing pseudo pixel units, and the touch sensing pseudo pixel units arranged in the first direction are connected.

4. The imaging sensor according to claim 1, further comprising:
    a pixel reading circuit disposed on the substrate, the pixel reading circuit being connected with the plurality of pixel units and configured to read the electric pixel signal, wherein the at least one touch sensing pseudo pixel unit is disposed between the pixel reading circuit and the plurality of bias voltage pseudo pixel units.

5. The imaging sensor according to claim 4, further comprising:
    a plurality of pixel data lines which connect the pixel reading circuit with the plurality of pixel units and are configured to transmit the electric pixel signal, the plurality of pixel data lines extending along a second direction,
    wherein the at least one touch sensing pseudo pixel unit comprises a plurality of touch sensing pseudo pixel units, and the touch sensing pseudo pixel units arranged in the second direction are connected.

6. The imaging sensor according to claim 1, further comprising:
    a plurality of pixel data lines disposed on the substrate, the plurality of pixel data lines being connected with the plurality of pixel units, being configured to transmit the electric pixel signal which is read by a pixel reading circuit, extending along a second direction, and being connected with the pixel reading circuit at one side of the pixel array, wherein the at least one touch sensing pseudo pixel unit is disposed on the other side of the pixel array along the second direction.

7. The imaging sensor according to claim 6, wherein the at least one touch sensing pseudo pixel unit comprises a plurality of touch sensing pseudo pixel units arranged in array to form a touch sensing array, wherein the touch sensing pseudo pixel units in a same row are connected, or the touch sensing pseudo pixel units in a same column are connected, or the touch sensing pseudo pixel units in a same row are connected and the touch sensing pseudo pixel units in a same column are connected.

8. The imaging sensor according to claim 1, further comprising:
at least one touch sensing data line disposed on the substrate, the at least one touch sensing data line being connected with the at least one touch sensing pseudo pixel unit and configured to transmit the electric touch signal read by a touch sensing reading circuit which is connected with the at least one touch sensing pseudo pixel unit via the at least one touch sensing data line.

9. The imaging sensor according to claim 8, wherein the at least one touch sensing pseudo pixel unit comprises a plurality of touch sensing pseudo pixel units arranged in array to form a touch sensing array,
wherein the plurality of touch sensing pseudo pixel units in the touch sensing array are connected, and the touch sensing array is connected with the touch sensing reading circuit via the touch sensing data line.

10. The imaging sensor according to claim 1, wherein the pixel unit comprises a photodiode and a switching device connected with the photodiode, and the photodiode comprises a photosensitive region for acquiring an optical signal,
wherein the bias voltage pseudo pixel unit comprises a first light absorbing conductive structure and a pseudo switch connected with the first light absorbing conductive structure, the first light absorbing conductive structure comprises a first light absorbing region, and a projection of the first light absorbing region on a surface of the substrate is same as a projection of the photosensitive region on the surface of the substrate,
wherein the touch sensing pseudo pixel unit comprises a second light absorbing conductive structure, the second light absorbing conductive structure comprises a second light absorbing region, and a projection of the second light absorbing region on the surface of the substrate is same as the projection of the photosensitive region on the surface of the substrate.

11. The imaging sensor according to claim 10, further comprising:
a scanning line disposed on the substrate and extending along a first direction, the scanning line being configured to transmit a drive signal which is capable of making the electric pixel signal be read; and
a pixel data line disposed on the substrate and extending along a second direction, the pixel data line being configured to transmit the electric pixel signal,
wherein the photodiode comprises a bottom electrode on the substrate, a diode on the bottom electrode, and a top electrode on the diode;
the switching device comprises a gate connected with the scanning line, a source connected with the bottom electrode, a drain connected with the pixel data line, and a semiconductor layer connected with the source and the drain and disposed at a position above the gate;

the first light-absorbing conductive structure comprises a first middle conductive layer on the substrate, a first light absorbing layer on the first middle conductive layer, and a first upper conductive layer on the first light absorbing layer, a projection of the first middle conductive layer on the surface of the substrate is same as a projection of the bottom electrode on the surface of the substrate, and a projection of the first light absorbing layer on the surface of the substrate is same as a projection of the diode on the surface of the substrate, and a projection of the first upper conductive layer on the surface of the substrate is same as a projection of the top electrode on the surface of the substrate;
the pseudo switch comprises a pseudo gate connected with the scanning line, a pseudo source connected with the first middle conductive layer, and a pseudo channel layer connected with the pseudo source and disposed at a position above the pseudo gate, wherein a projection of the pseudo gate on the surface of the substrate is same as a projection of the gate on the surface of the substrate, a projection of the pseudo source on the surface of the substrate is same as a projection of the source on the surface of the substrate, and a projection of the pseudo channel layer on the surface of the substrate is same as a projection of the semiconductor layer on the surface of the substrate; and
the second light absorbing conductive structure comprises a second middle conductive layer on the substrate, a second light absorbing layer on the second middle conductive layer, and a second upper conductive layer on the second light absorbing layer, and a projection of the second light absorbing layer on the surface of the substrate is same as the projection of the diode on the surface of the substrate.

12. The imaging sensor according to claim 11, wherein bottom electrodes of photodiodes in adjacent pixel units are electrically insulated from each other, and the imaging sensor further comprises:
a bias voltage connection line for connecting adjacent bias voltage pseudo pixel units, the bias voltage connection line being connected with the first middle conductive layer of the first light absorbing conductive structure in the bias voltage pseudo pixel unit; and
a touch sensing connection line for connecting adjacent touch sensing pseudo pixel units, the touch sensing connection line being connected with the second middle conductive layer of the second light absorbing conductive structure in the touch sensing pseudo pixel unit.

13. The imaging sensor according to claim 11, further comprising:
a connecting layer disposed on the pixel array and electrically connected with the top electrode via a first though hole, the connecting layer extending on the plurality of bias voltage pseudo pixel units and being electrically connected with the first upper conductive layer via a second through hole.

14. The imaging sensor according to claim 11, further comprising:
a dielectric layer disposed on the substrate,
wherein the photodiode is disposed on the dielectric layer; and in the switching device, the gate is disposed between the substrate and the dielectric layer, and the source, the drain and the semiconductor layer are disposed on the dielectric layer;
the first light absorbing conductive structure is disposed on the dielectric layer, the pseudo gate is disposed between the substrate and the dielectric layer, and the pseudo source and the pseudo channel layer are disposed on the dielectric layer;

the second light absorbing conductive structure is disposed on the dielectric layer;

the pixel unit further comprises a storage electrode disposed between the dielectric layer and the substrate, the storage electrode and the bottom electrode being used to form a storage capacitor;

the bias voltage pseudo pixel unit further comprises a first lower conductive layer disposed between the dielectric layer and the substrate, a projection of the first lower conductive layer on the surface of the substrate being same as a projection of the storage electrode on the surface of the substrate, and the first lower conductive layer being in contact with the first middle conductive layer through a third through hole penetrating through the dielectric layer; and the touch sensing pseudo pixel unit further comprises a second lower conductive layer disposed between the dielectric layer and the substrate, a projection of the second lower conductive layer on the surface of the substrate being same as the projection of the storage electrode on the surface of the substrate.

15. The imaging sensor according to claim 14, wherein the at least one touch sensing pseudo pixel unit comprises a first touch sensing pseudo pixel unit with a fourth through hole and a second touch sensing pseudo pixel unit without a fourth through hole, and the second lower conductive layer of the first touch sensing pseudo pixel unit is connected with the second middle conductive layer via the fourth through hole.

16. The imaging sensor according to claim 15, wherein the touch sensing pseudo pixel units arranged in the first direction are connected; and the first touch sensing pseudo pixel unit is disposed at one side of the connected second touch sensing pseudo pixel unit which is close to the pixel array, or the first touch sensing pseudo pixel unit is disposed at one side of the connected second touch sensing pseudo pixel unit which is away from the pixel array, or the first touch sensing pseudo pixel unit is disposed at one side of the connected second touch sensing pseudo pixel unit which is close to the pixel array and at one side of the connected second touch sensing pseudo pixel unit which is away from the pixel array.

17. The imaging sensor according to claim 15, further comprising:

a plurality of pseudo data lines disposed in the second direction, the pseudo data lines being disposed between adjacent second touch sensing pseudo pixel units and between adjacent scanning lines, and being parallel to the pixel data lines, and line width of the pseudo data lines is equal to line width of the pixel data lines.

18. The imaging sensor according to claim 17, wherein a region surrounded by a projection of the scanning line on the surface of the substrate and a projection of the pixel data line on the surface of the substrate is a pixel area, a region surrounded by a projection of the scanning line on the surface of the substrate and a projection of the pseudo data line on the surface of the substrate is a touch sensing pseudo pixel area, and a projection of the pixel unit in the pixel area is same as a projection of the second touch sensing pseudo pixel unit in the touch sensing pseudo pixel area.

19. The imaging sensor according to claim 18, wherein the bottom electrode of the photodiode, and the source, the drain, the gate and the semiconductor layer of the switching device are used to form a light shielding laminated layer; and a projection of the second middle conductive layer of the second light absorbing conductive structure in the touch sensing pseudo pixel area is same as a projection of the light shielding laminated layer in the touch sensing pseudo pixel area.

20. An imaging module, comprising:
an imaging sensor, wherein the imaging sensor comprises:
a substrate;
a plurality of pixel units disposed on the substrate, the plurality of pixel units being configured to acquire an optical signal carrying imaging information and convert the optical signal into an electric pixel signal, and arranged in array to form a pixel array;
a plurality of bias voltage pseudo pixel units disposed around the pixel array, the plurality of bias voltage pseudo pixel units being connected with the plurality of pixel units, and configured to provide a bias voltage to the plurality of pixel units; and
at least one touch sensing pseudo pixel unit disposed at one side of the plurality of bias voltage pseudo pixel units which is away from the plurality of pixel units, the at least one touch sensing pseudo pixel unit being configured to form a capacitor structure to sense a touch to form an electric touch signal; and
a shell with a through hole which exposes the plurality of pixel units, the plurality of bias voltage pseudo pixel units and the at least one touch sensing pseudo pixel unit.

* * * * *